United States Patent
Shibata et al.

(10) Patent No.: US 10,050,138 B2
(45) Date of Patent: Aug. 14, 2018

(54) NITRIDE SEMICONDUCTOR DEVICE

(71) Applicant: Panasonic Intellectual Property Management Co., Ltd., Osaka (JP)

(72) Inventors: Daisuke Shibata, Kyoto (JP); Kenichiro Tanaka, Osaka (JP); Masahiro Ishida, Osaka (JP); Shinichi Kohda, Kyoto (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 25 days.

(21) Appl. No.: 15/216,691

(22) Filed: Jul. 21, 2016

(65) Prior Publication Data

US 2016/0329421 A1    Nov. 10, 2016

Related U.S. Application Data

(63) Continuation of application No. PCT/JP2015/000386, filed on Jan. 29, 2015.

(30) Foreign Application Priority Data

Feb. 13, 2014 (JP) .................. 2014-025356
Mar. 31, 2014 (JP) .................. 2014-071476

(51) Int. Cl.
*H01L 29/778* (2006.01)
*H01L 29/417* (2006.01)
(Continued)

(52) U.S. Cl.
CPC ........ *H01L 29/7788* (2013.01); *H01L 29/045* (2013.01); *H01L 29/2003* (2013.01);
(Continued)

(58) Field of Classification Search
CPC .................................................. H01L 29/7788
See application file for complete search history.

(56) References Cited

U.S. PATENT DOCUMENTS

2003/0042538 A1    3/2003  Kumar et al.
2006/0220060 A1    10/2006 Nakata et al.
(Continued)

FOREIGN PATENT DOCUMENTS

JP    2003-068981    3/2003
JP    2006-286942    10/2006
(Continued)

OTHER PUBLICATIONS

International Search Report of PCT application No. PCT/JP2015/000386 dated Mar. 31, 2015.

*Primary Examiner* — Joseph C Nicely
*Assistant Examiner* — Lamont Koo
(74) *Attorney, Agent, or Firm* — McDermott Will & Emery LLP

(57) ABSTRACT

A nitride semiconductor device according to the present disclosure includes a substrate; a first nitride semiconductor layer which is formed on the substrate, and which has a C-plane as a main surface; a second nitride semiconductor layer which is formed on the first nitride semiconductor layer, and which has p-type conductivity; and a first opening which is formed in the second nitride semiconductor layer, and which reaches the first nitride semiconductor layer. The nitride semiconductor device further includes a third nitride semiconductor layer which is formed so as to cover the first opening in the second nitride semiconductor layer; a first electrode which is formed on the third nitride semiconductor layer so as to include a region of the first opening; and a second electrode which is formed on the rear surface of the substrate.

16 Claims, 20 Drawing Sheets

(51) Int. Cl.
*H01L 29/20* (2006.01)
*H01L 29/861* (2006.01)
*H01L 29/872* (2006.01)
*H01L 29/205* (2006.01)
*H01L 29/04* (2006.01)
H01L 29/423 (2006.01)
H01L 29/10 (2006.01)

(52) U.S. Cl.
CPC ...... *H01L 29/205* (2013.01); *H01L 29/41741* (2013.01); *H01L 29/7789* (2013.01); *H01L 29/861* (2013.01); *H01L 29/872* (2013.01); H01L 29/1066 (2013.01); H01L 29/42316 (2013.01)

(56) References Cited

U.S. PATENT DOCUMENTS

| | | | | |
|---|---|---|---|---|
| 2011/0241017 | A1* | 10/2011 | Ikeda | H01L 29/0847 |
| | | | | 257/76 |
| 2014/0004668 | A1* | 1/2014 | Saito | H01L 29/66462 |
| | | | | 438/172 |
| 2014/0203329 | A1* | 7/2014 | Saitoh | H01L 29/66462 |
| | | | | 257/194 |

FOREIGN PATENT DOCUMENTS

| | | |
|---|---|---|
| JP | 2011-155221 | 8/2011 |
| JP | 2011-222765 | 11/2011 |

* cited by examiner

NITRIDE SEMICONDUCTOR DEVICE

BACKGROUND

1. Technical Field

The present disclosure relates to a nitride semiconductor device that is able to be applied to a power transistor used by a power source circuit of consumer equipment, such as a television.

2. Description of the Related Art

Nitride semiconductors represented by GaN are so-called wide band gap semiconductors, the band gaps of GaN and AlN are greater than 3.4 eV and 6.2 eV at room temperature, respectively. Nitride semiconductors have a large dielectric breakdown field and have a saturated drift velocity of electrons greater than compound semiconductors such as GaAs or Si semiconductors and the like. Therefore, experimental development of power transistors used in nitride semiconductors which are advantageous in increasing output and increasing breakdown voltage is currently being actively performed.

In an AlGaN/GaN hetero structure, a high concentration of two-dimensional electron gas (2DEG) occurs at the heterointerface due to spontaneous polarization and piezoelectric polarization on the C-plane ((0001) plane). A sheet carrier density of $1 \times 10^{13}$ cm$^{-2}$ or more is obtained in the two-dimensional electron gas even when undoped.

AlGaN indicates a three-dimensional mixed crystal $Al_xGa_{1-x}N$ (x is a given value, wherein $0 \leq x \leq 1$). Below, for the multidimensional mixed crystal, the arrangement of the respective constituent element symbols is abbreviated to, for example, AlInN, GaInN or the like. For example, the nitride semiconductors $Al_xGa_{1-x-y}In_yN$ (x and y are given values, wherein $0 \leq x \leq 1$, $0 \leq y \leq 1$) is abbreviated to AlGaInN.

FIG. 19 is a cross-sectional view of a field effect transistor in an example of the related art. In FIG. 19, AlGaN buffer layer 102 (layer thickness 0.5 µm), GaN drift layer 103 (layer thickness 4 µm), p-GaN barrier layer 104 (layer thickness 0.5 µm), and AlGaN cap layer 105 (layer thickness 0.3 µm) are formed in this order on conductive SiC substrate 101. An opening which reaches drift layer 103 is formed on cap layer 105, and GaN electron transit layer 106 (layer thickness 50 nm), AlN intermediate layer 107 (layer thickness 2 nm), and AlGaN electron supply layer 108 (layer thickness 30 nm) are formed in this order by regrowth. Ni gate electrode 109 is formed to cover the side surface of the opening, and Ti/Al source electrode 110 is formed on a flat section of AlGaN electron supply layer 108. Drain electrode 111 is formed on the rear surface of SiC substrate 101. A drain current flows from drain electrode 111 on the rear surface side of the substrate, through GaN drift layer 103, to source electrode 110 on the front surface side, and is a vertical transistor which opens and closes, through a gate voltage, the channel of the two-dimensional electron gas (2DEG) generated at the AlGaN/GaN heterointerface formed in the side wall of the opening.

CITATION LIST

Patent Literature

PTL 1: Japanese Patent Unexamined Publication No. 2006-286942

SUMMARY

According to this disclosure, there is provided a nitride semiconductor device including: a substrate; a first nitride semiconductor layer which is formed on the substrate, and which has a C-plane as a main surface; a second nitride semiconductor layer which is formed on the first nitride semiconductor layer, and which has p-type conductivity; and a first opening which is formed in the second nitride semiconductor layer, and which reaches the first nitride semiconductor layer. The nitride semiconductor device also includes a third nitride semiconductor layer which is formed to cover the first opening in the second nitride semiconductor layer, and which is formed by a nitride semiconductor; a first electrode that is formed on the third nitride semiconductor layer so as to include a region of the first opening; and a second electrode that is formed on the rear surface of the substrate. A layer thickness Gx of the third nitride semiconductor layer on a side wall of the first opening, the layer thickness being in a direction parallel to the C-plane, is greater than a layer thickness Gy of the third nitride semiconductor layer on a flat section outside of the first opening, the layer thickness being in a direction perpendicular to the C-plane.

According to this configuration, it is possible to distance the third nitride semiconductor layer of the side wall of the opening and the second nitride semiconductor layer having p-type conductivity, thereby suppressing a decrease in the carrier density of the third nitride semiconductor layer. In so doing, the on-resistance of the nitride semiconductor device can be reduced.

According to this disclosure, the nitride semiconductor device further includes a third electrode formed on the third nitride semiconductor layer and at a position separated from the first electrode.

In the nitride semiconductor device according to this disclosure, it is preferable that a fourth nitride semiconductor layer formed of a nitride semiconductor layer be further formed on the third nitride semiconductor layer, and the layer thickness Ax of the fourth nitride semiconductor layer, the layer thickness being in a direction parallel to the C-plane on the side wall of the first opening, be thicker than the layer thickness Ay of the fourth nitride semiconductor layer, the layer thickness being in a direction perpendicular to the C-plane in a flat section on the outside of the first opening.

According to this preferable configuration, the Al constitution of the fourth nitride semiconductor layer in the side wall of the first opening can be reduced compared to the flat section. Accordingly, the threshold of the nitride semiconductor device can be increased, that is, set to a normally off operation.

In the nitride semiconductor device according to this disclosure, it is preferable that Gx/Gy be greater than Ax/Ay.

According to the preferred configuration, it is possible to extremely suppress a lowering of the Al constitution of the fourth nitride semiconductor layer of the side wall of the first opening while distancing the third nitride semiconductor layer of the side wall of the first opening from the second semiconductor layer having p-type conductivity. In so doing, the on-resistance of the nitride semiconductor device can be reduced.

In the nitride semiconductor device according to this disclosure, it is preferable that a fifth nitride semiconductor layer having p-type conductivity be further formed between the first electrode and the third nitride semiconductor layer.

According to the preferred configuration, because the potential of the third nitride semiconductor layer rises due to the fifth nitride semiconductor layer having p-type conductivity, the carrier density of the first electrode can be reduced and a normally off operation is possible.

In the nitride semiconductor device according to this disclosure, it is preferable that the end portion of the first electrode or the end portion of the fifth nitride semiconductor layer be positioned on the outside of the first opening.

According to the preferred configuration, the threshold of the field effect transistor that is the nitride semiconductor device can be determined not only for the side wall of the first opening, but also for the flat section.

It is preferable that the nitride semiconductor device according to this disclosure further include a second opening which extends from the third nitride semiconductor layer as far as the second nitride semiconductor layer, and that a third electrode be formed on the second opening.

It is preferable that the nitride semiconductor device according to this disclosure further include a fourth semiconductor layer formed of an undoped nitride semiconductor between the second nitride semiconductor layer and the third nitride semiconductor layer.

In the nitride semiconductor device according to this disclosure, it is preferable that the fourth semiconductor layer be formed of two layers, and the band gap of the layer on the closer side to the second nitride semiconductor layer be smaller than the band gap of the layer on the closer side to the third nitride semiconductor layer.

According to this disclosure, it is preferable that the nitride semiconductor device further include a block layer formed of an insulating or semi-insulating nitride semiconductor layer and which is formed on the second semiconductor layer, and a fourth nitride semiconductor layer with a greater band gap than the third nitride semiconductor layer. The third nitride semiconductor layer is formed on the block layer, and the first opening extends from the block layer as far as the first nitride semiconductor layer.

According to the configuration, since it is possible to exclude the parasitically underlying bipolar transistor, it is possible to obtain high breakdown voltage characteristics for the nitride semiconductor device due to the high dielectric breakdown strength inherent in the nitride semiconductors.

In the nitride semiconductor device according to this disclosure, it is preferable that the block layer be a GaN layer to which $3 \times 10^{17}$ cm$^{-3}$ of or more C is added.

In the nitride semiconductor device according to this disclosure, it is preferable that the block layer be a GaN layer to which one or more of Fe, Mg, and B is injected.

It is preferable that the nitride semiconductor device according to this disclosure further include a second opening which extends from the fourth nitride semiconductor layer as far as the second nitride semiconductor layer and which is arranged at a position different from that of the first opening.

In the nitride semiconductor device according to this disclosure, it is preferable that a fifth nitride semiconductor layer having p-type conductivity be further provided between the first electrode and the fourth nitride semiconductor layer. According to the preferred configuration, because the potential of the channel rises due to the fifth nitride semiconductor layer, the carrier density below the first electrode can be reduced, and the nitride semiconductor device is capable of normally off operation.

It is preferable that the nitride semiconductor device according to this disclosure further include a third electrode which is different from the first electrode and has ohmic characteristics, and is positioned at the second opening.

In the nitride semiconductor device according to this disclosure, it is preferable that the second nitride semiconductor layer be formed directly below the second opening, and the block layer and the first nitride semiconductor layer be in contact in the first opening.

According to the nitride semiconductor device of this disclosure, a superior nitride semiconductor device having low on-resistance can be provided.

DETAILED DESCRIPTIONS

Figure 1:
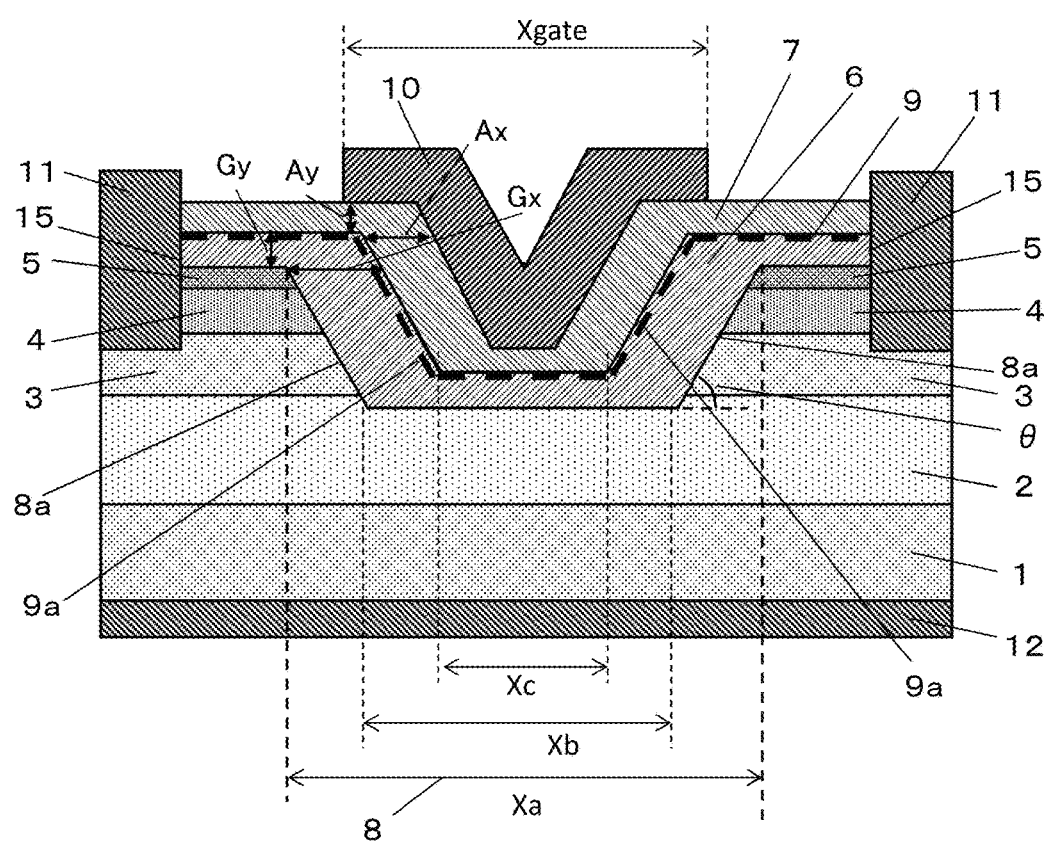
FIG. 1 is a cross-sectional view of a field effect transistor of a first exemplary embodiment.

First, problems of the related art will be described.

In general, crystal growth of the vertical transistor is performed so that the C-plane of the grown GaN crystal is parallel to the substrate surface. Although the crystal orientation is not described in the vertical transistor of the above-described related art example, if the C-plane of the GaN crystal is made parallel to the substrate surface, the 2DEG carrier density (the sheet carrier density of 2DEG) of the AlGaN/GaN heterojunction interface of the gate opening side wall becomes lower than that of the 2DEG channel of the AlGaN/GaN heterojunction interface of a flat section. This is due to the polarization amount of the C-plane of the GaN crystal becoming maximal, and polarization not occurring in the a plane or m plane perpendicular to the C-plane due to the piezoelectric polarization occurring in the AlGaN/GaN heterojunction interface. That is, the 2DEG carrier density is lowered as the heterojunction surface inclines with respect to the C-plane.

Although the horizontal direction and the vertical direction of the layer thickness of the electron transit layer are not described in the vertical transistor of the above-described related art example, in light of the drawings, the layer thickness of the electron transit layer is the same at the gate opening side wall. Because the distance from the 2DEG of the opening side wall to the p-GaN barrier layer is short in such a configuration, the channel is more prone to constriction than the flat section 2DEG.

For the above-described reason, a problem arises in the vertical field effect transistor of the related art in which the 2DEG carrier density of the opening side wall is greatly lowered and the on-resistance is increased.

The present disclosure was conceived in consideration of the above-described problems, and provides a nitride semiconductor device having low on-resistance in a vertical field effect transistor of a nitride semiconductor device.

In the vertical transistor of the related art, an npn structure of a channel layer (two-dimensional electron gas) formed with the GaN drift layer and the p-type GaN barrier layer by regrowth is parasitically present between the source electrode and the drain electrode. The npn structure becomes a parasitic bipolar transistor and exerts an adverse influence on the device. In particular, when the device is off, the parasitic bipolar transistor is turned on when a current flows to the p-type GaN barrier layer, a short circuit occurs between the drain and source of the vertical transistor, and a breakdown voltage of the vertical transistor is not obtained.

For the above-described reason, a problem arises in the vertical field effect transistor of the related art in which the high breakdown voltage characteristics that the vertical transistor has are not obtained due to the parasitic npn bipolar transistor.

The present disclosure was conceived in consideration of the above-described problems, and provides a nitride semiconductor device having a high breakdown voltage in a vertical field effect transistor of a nitride semiconductor device.

Below, exemplary embodiments of the disclosure are described with reference to the drawings.

First Exemplary Embodiment

FIG. 1 illustrates a cross-sectional view of the field effect transistor in the first exemplary embodiment. As illustrated in FIG. 1, the field effect transistor of the disclosure has the following configuration. Drift layer 2 formed of n-type GaN with a thickness of 8 μm and a carrier density of $1\times10^{16}$ cm$^{-3}$, first base layer 3 formed of p-type GaN with a thickness of 400 nm and a carrier density of $1\times10^{17}$ cm$^{-3}$, second base layer 4 formed of undoped GaN with a thickness of 200 nm, and third base layer 5 formed of undoped $Al_{0.2}Ga_{0.8}N$ with a thickness of 20 nm are formed in this order on substrate 1 formed of n-type GaN with a thickness of 300 μm and a carrier density of $1\times10^{18}$ cm$^{-3}$, with the C-plane ((0001) plane) as the main surface. Gate opening 8 that reaches drift layer 2 passing through third base layer 5, second base layer 4, and first base layer 3 is formed close to the surface side of third base layer 5. First regrowth layer 6 formed of undoped GaN with a thickness of 100 nm, second regrowth layer formed of undoped AlN with a thickness of 1 nm, and third regrowth layer 7 formed of undoped $Al_{0.2}Ga_{0.8}N$ with a thickness of 50 nm are formed in order by crystal regrowth to cover gate opening 8. Gate electrode 10 formed of Pd is further formed on third regrowth layer 7. Second opening 15 that reaches first base layer 3 passing through third regrowth layer 7, second regrowth layer, first regrowth layer 6, third base layer 5, and second base layer 4 is formed to pinch gate electrode 10, and source electrode 11 formed of Ti and Au is formed to cover second opening 15. Drain electrode 12 formed of Ti and Al is formed on the rear surface of substrate 1. Since the layer thickness is thin, the second regrowth layer is not shown in FIG. 1.

The main surface of each semiconductor layer which is capable of crystal growth due to substrate 1 is the C-plane.

Two-dimensional electron gas layer 9 is formed at the interface between first regrowth layer 6 and the second regrowth layer, and two-dimensional electron gas layer 9 forms an electron transit layer (channel layer) of the field effect transistor. Although a portion having an incline with respect to the main surface of substrate 1 occurs in two-dimensional electron gas layer 9, the portion is referred to as inclined carrier region 9a.

First regrowth layer 6, the second regrowth layer, and third regrowth layer 7 are each parallel to the main surface and the inclined surface.

For each semiconductor layer, n-type conductivity is imparted by adding Si, and p-type conductivity is imparted by adding Mg.

Gate electrode 10 is in Schottky contact with third regrowth layer 7, and source electrode 11 is in ohmic contact with the two-dimensional electron gas layer. Drain electrode 12 is in ohmic contact with substrate 1.

The configuration of each semiconductor layer related to the field effect transistor of the disclosure is recorded in the following Table 1.

TABLE 1

| | Constitution | Layer Thickness | Conductivity Type | Carrier density (cm$^{-3}$) |
|---|---|---|---|---|
| Substrate 1 | GaN | 300 μm | n | $1 \times 10^{19}$ |
| Drift Layer 2 | GaN | 8 μm | n | $1 \times 10^{16}$ |
| First Base Layer 3 | GaN | 400 nm | p | $1 \times 10^{17}$ |
| Second Base Layer 4 | GaN | 200 nm | Undoped | — |
| Third Base Layer 5 | $Al_{0.2}Ga_{0.8}N$ | 20 nm | Undoped | — |
| First Regrowth Layer 6 | GaN | 100 nm | Undoped | — |
| Second Regrowth Layer | AlN | 1 nm | Undoped | — |
| Third Regrowth Layer 7 | $Al_{0.2}Ga_{0.8}N$ | 50 nm | Undoped | — |

When the opening width of gate opening 8 is Xa, the width of the bottom of gate opening 8 is Xb, and the width of the bottom surface directly below gate electrode 10 when first regrowth layer 6 is formed is Xc, the relationships Xa=6.4 μm, Xb=5 μm, and Xc=2 μm are satisfied. When the angle of the side surface of gate opening 8 formed with the main surface is θ, θ=45 degrees.

When the width (width along the <1-100> direction, the so-called gate length) of gate electrode 10 is Xgate, Xgate=7 μm.

Each semiconductor layer which forms the field effect transistor is formed by metal organic vapor phase epitaxy (referred to below as MOVPE). Gate opening 8 is formed by dry etching. The MOVPE conditions related to first regrowth layer 6, the second regrowth layer, and third regrowth layer 7 after gate opening 8 is formed are denoted in Table 2.

TABLE 2

| | Raw Material Gas | Flow Rate | Crystal Growth Temperature |
|---|---|---|---|
| First Regrowth Layer 6 | TMG | 15 sccm | 1050° C. |
| | Ammonia | 30 slm | |
| Second Regrowth Layer | TMA | 20 sccm | 1100° C. |
| | Ammonia | 30 slm | |
| Third Regrowth Layer 7 | TMG | 15 sccm | 1100° C. |
| | TMA | 20 sccm | |
| | Ammonia | 30 slm | |

In Table 2, TMG represents trimethyl gallium, and TMA represents trimethyl aluminum. sccm and slm are the units of the flow rate of gas that flows per minute when converted to standard conditions (0° C., 1 atmosphere), 1 sccm is the flow rate of 1 cm³ of gas in one minute, and 1 slm is the flow rate of one litre of gas in one minute.

(a) Arrangement of Field Effect Transistor

Figure 2B:
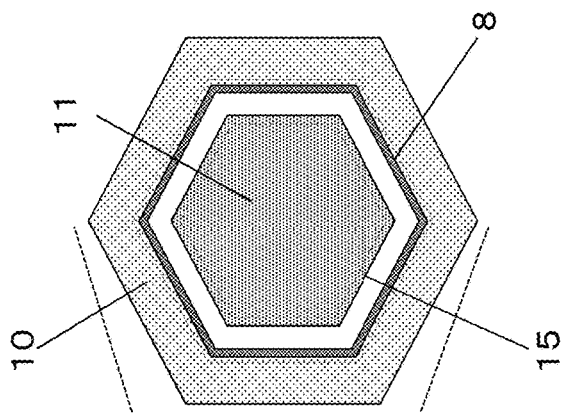
FIG. 2B is a top view of the unit cell of the field effect transistor of the first exemplary embodiment.
Figure 2A:
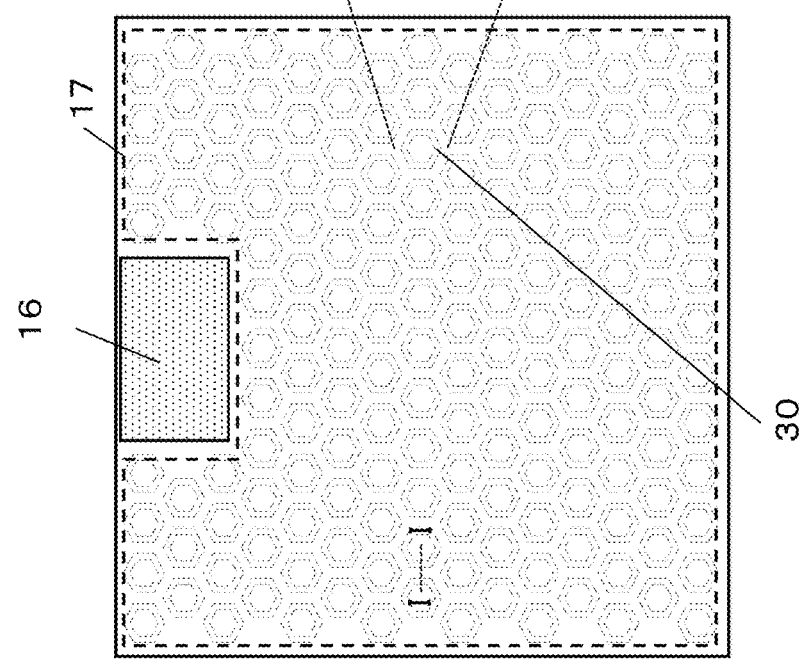
FIG. 2A is a top view of the entire field effect transistor of the first exemplary embodiment.

The arrangement of the field effect transistor of the disclosure will be described using FIGS. 2A and 2B. FIGS. 2A and 2B are drawings illustrating the element placement in the field effect transistor in the disclosure, FIG. 2A is a drawing when viewed from the electrode side of the all elements of the field effect transistor, and 2B is a drawing illustrating the configuration of unit cell 30.

The field effect transistor of the disclosure has a configuration in which a plurality of hexagonal unit cells 30 are disposed in a maximally dense state as illustrated in FIG. 2A, and the shape in which the centers of source electrodes 11 are joined forms a hexagon. As illustrated in FIG. 2B, gate electrode 10 is disposed so as to surround source electrode 11. As in FIG. 2B, second opening 15 has a hexagonal shape and the side surface of second opening 15 is the [1-100] plane. The term [1-100] plane collectively indicates the (1-100) plane and planes equivalent thereto.

As illustrated in FIG. 2A, gate electrode 10 is electrically connected to gate pad 16, source pad 17, the region of which is indicated by the broken line, is formed on the insulating layer (not shown) formed on gate electrode 10. A hole (not shown) is provided in the insulating layer and source electrode 11 and source pad 17 are electrically connected via the hole.

The cross-sectional view illustrated in FIG. 1 includes the line segment I-I in FIG. 2A and is a cross-sectional view taken along a plane perpendicular to the main surface of substrate 1.

Although a case of a hexagonal cell as unit cell 30 is illustrated in FIGS. 2A and 2B, the shape of unit cell 30 can also be circular, rectangular, or triangular.

The placement of unit cells 30 is not limited to a maximally dense hexagonal placement, and linear placement or circular placement is also possible.

(b) Investigation Related to First Regrowth Layer 6

When the thickness of first regrowth layer 6 in the <1-100> direction is Gx and the thickness in the <0001> direction (direction perpendicular to the main surface of substrate 1) is Gy, since Gx=1.5 μm and Gy=0.1 μm in the field effect transistor of the disclosure, it is evident that $$Gx > Gy \qquad \text{Formula 1}$$

is satisfied. By doing so, it is possible to lengthen the distance between inclined carrier region 9a formed facing side wall 8a of gate opening 8 and first base layer 3, thereby suppressing a lowering of the sheet carrier density in inclined carrier region 9a. As a result, it is possible for the resistance of two-dimensional electron gas layer 9 to be reduced and for the on-resistance of the field effect transistor to be reduced.

The mechanism by which the on-resistance of the field effect transistor is reduced will be described below in detail.

Since substrate 1 has the C-plane as the main surface, each semiconductor layer which is formed on substrate 1 and formed of a group-III nitride semiconductor has polarity. Distortion arises due to differences in the lattice constant between third regrowth layer 7 and the second regrowth layer and first regrowth layer 6, and polarization charge arises particularly due to spontaneous polarization and piezoelectric polarization between the second regrowth layer and first regrowth layer 6 due to the distortion. It is possible to increase the sheet carrier density in two-dimensional electron gas layer 9 due to the polarization charge.

Meanwhile, since the direction of the polarization is parallel to the <0001> plane, the polarization charge density becomes maximal in the C-plane. The interface between the second regrowth layer and first regrowth layer 6 has a surface inclined with respect to the C-plane between two source electrodes 11 which pinch gate electrode 10. In a case of having a plane inclined with respect to the C-plane, the polarization charge density on the inclined plane becomes lower than the polarization charge density on the C-plane. By the interface between the second regrowth layer and first regrowth layer 6 inclining due to the C-plane, thereby reducing the polarization charge density, the sheet carrier density of electrons in inclined carrier region 9a is reduced.

First base layer 3 is p-type, and the depletion layer spreads from first base layer 3 towards two-dimensional electron gas layer 9. As the sheet carrier density of two-dimensional electron gas layer 9 lowers, the greater the influence of the depletion layer and the more the resistance of two-dimensional electron gas layer 9 increases.

For the field effect transistor of the disclosure, by lengthening the distance between inclined carrier region 9a and first base layer 3 due to determining the values of Gx and Gy as in the formula (Equation 1), the distance between first base layer 3 and inclined carrier region 9a is lengthened and the influence of the spreading of the depletion layer on inclined carrier region 9a is reduced. In doing so, it is possible to reduce the resistance of two-dimensional electron gas layer 9.

Although second opening 15 for establishing contact with first base layer 3 formed of p-type GaN is provided on source electrode 11, it is possible to reduce the depth of gate opening 8 as the layer thickness of first regrowth layer 6 in the flat section becomes thinner. It is possible to reduce the processing time as the depth of gate opening 8 becomes thinner, and the coverage of source electrode 11 formed thereafter also becomes favorable.

(c) Investigation Related to Third Regrowth Layer 7

As first regrowth layer 6, the second regrowth layer, and third regrowth layer 7 are grown on gate opening 8, the width of the recessed section formed on gate opening 8 is reduced.

Generally, upon growing third regrowth layer 7 on gate opening 8, the crystal growth speed in side wall 8a of gate opening 8 and the crystal growth speed in the main surface direction are different, and since the incorporation rate of Al increases as the crystal growth speed reduces, the Al constitution of third regrowth layer 7 increases.

As the Al constitution of third regrowth layer 7 increases, the difference in the lattice constants between third regrowth layer 7 and first regrowth layer 6 increases, thereby increasing the polarization, and the sheet carrier density of two-dimensional electron gas layer 9 increases. Therefore, the resistance of two-dimensional electron gas layer 9 is reduced.

Since it is evident from the research in the above-described (b) that the sheet carrier density in inclined carrier region 9a from two-dimensional electron gas layer 9 is reduced, in order for the sheet carrier density in inclined carrier region 9a to be increased, the crystal growth speed in side wall 8a of gate opening 8 may be reduced to less than the crystal growth speed in the main surface direction and the Al constitution of third regrowth layer 7 that faces side wall 8a may be increased.

When the thickness in the <1-100> direction of third regrowth layer 7 is Ax and the thickness in the <0001> direction (direction perpendicular to the main surface of substrate 1) is Ay, and, based on this knowledge, Ax=60 nm and Ay=50 nm in the field effect transistor of the disclosure, and the relationship $$Ax < Ay \quad \text{Formula 2}$$

is satisfied. In doing so, the sheet carrier density of inclined carrier region 9a increases, and as a result, it is possible for the resistance of two-dimensional electron gas layer 9 to be reduced and for the on-resistance of the field effect transistor to be reduced.

Other features of the disclosure use semi insulating GaN as second base layer 4. Second base layer 4 functions as a block layer. That is, due to second base layer 4 exhibiting semi-insulating properties, a current does not flow via second base layer 4, and lowering of the breakdown voltage does not occur due to misoperation of the parasitic bipolar structure because a parasitic npn bipolar structure formed by drift layer 2, first base layer 3, and two-dimensional electron gas layer 9 is not formed. Accordingly, it is possible to realize increases in the breakdown voltage of the vertical transistor.

Any material may be used for second base layer 4 as long as the material is an insulating layer or semi-insulating layer, and a GaN layer to which $3 \times 10^{17}$ cm$^{-3}$ or more and preferably $1 \times 10^{18}$ cm$^{-3}$ or more of C (carbon) is added may be used. There is no limitation to the GaN layer, and it is possible to use an AlN layer, an AlGaN layer, an InGaN layer, and an InAlGaN layer. It is preferable that the concentration of Si or O (oxygen) included in second base layer 4 be made lower than the concentration of C and, for example, $5 \times 10^{16}$ cm$^{-3}$ or less is preferable, and $2 \times 10^{16}$ cm$^{-3}$ or less is more preferable.

Second base layer 4 may be formed by ion injection of Mg, Fe, B and the like. If an ion species able to increase resistance is used, the same effects as the other ion species are obtained.

Figure 3:
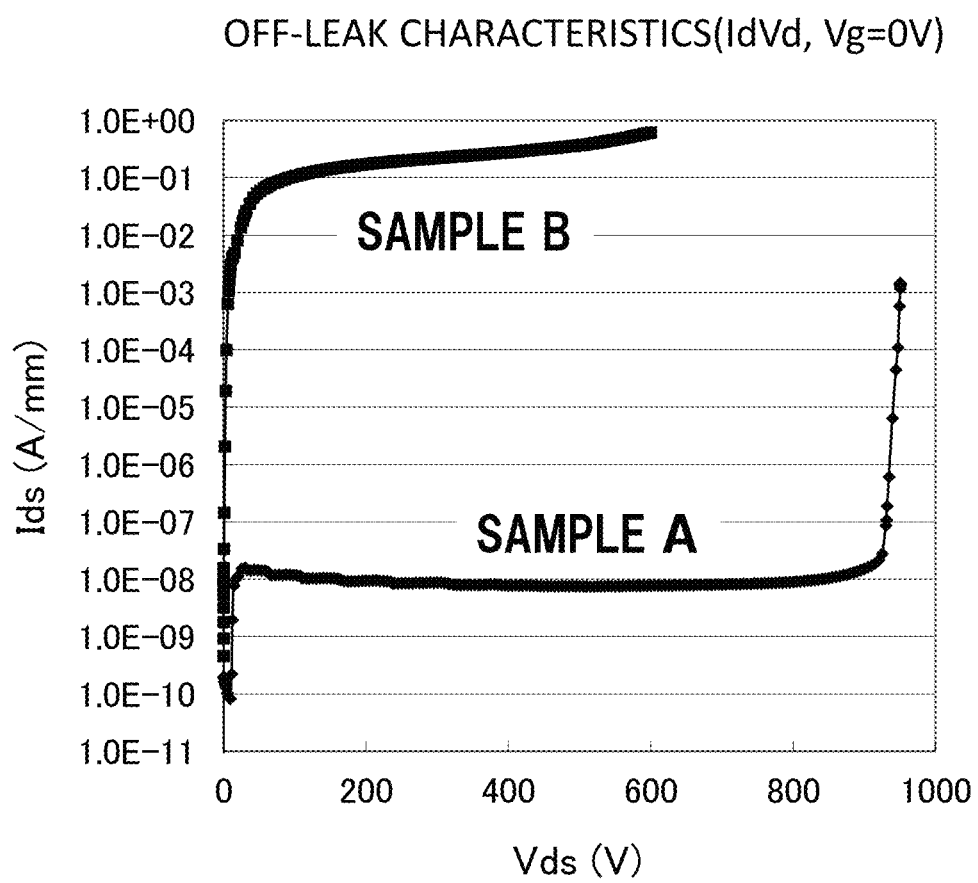
FIG. 3 is a drawing which compares off characteristics of the field effect transistor in the first exemplary embodiment.

FIG. 3 is a drawing illustrating the relationship between the voltage between the drain and source (Vds) and the current between the drain and source (Ids) when the gate voltage is 0 v for the field effect transistor (sample A) which is the nitride semiconductor device of the disclosure illustrated in FIG. 1 and the field effect transistor (sample B) in a case where second base layer 4 is not used in the nitride semiconductor device illustrated in FIG. 1, that is when first base layer 3 and third base layer 5 are in contact. In FIG. 3, the vertical axis represents a logarithmic graph, and, for example, 1.0 E$^{-8}$ represents $1 \times 10^{-8}$ (that is, E represents raising to the power of 10).

According to FIG. 3, in the sample A, even if Vds exceeds 900 V, Ids is approximately $1 \times 10^{-8}$ A/mm, whereas, in sample B, even if Vds is a low value, Ids becomes greater than $1 \times 10^{-2}$ A/mm. In light of this, it is clear that the sample A has a considerably lower leakage current than sample B, that is, the breakdown voltage is considerably improved.

Figure 4A:
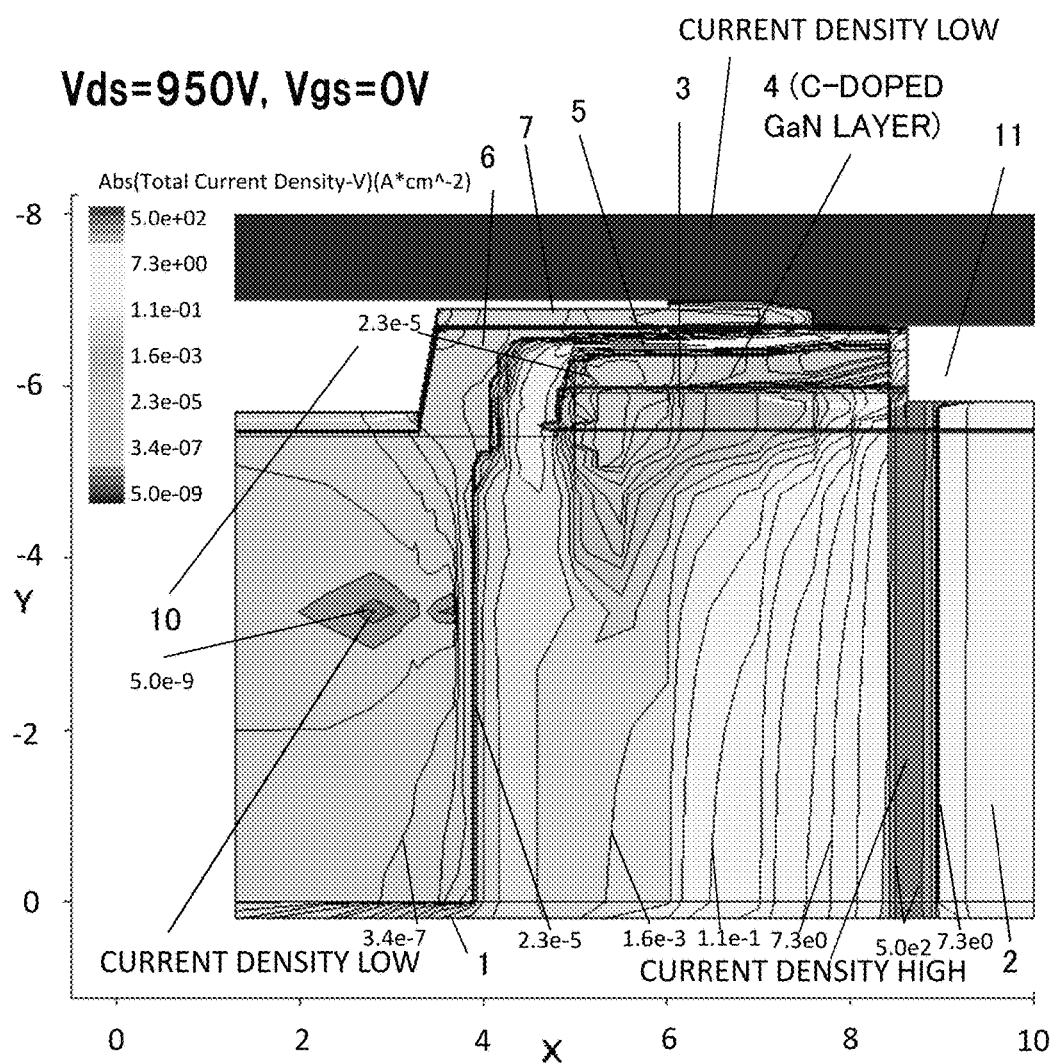
FIG. 4A is a drawing illustrating a current density profile (simulation) during dielectric breakdown according to the field effect transistor of sample A.
Figure 4B:
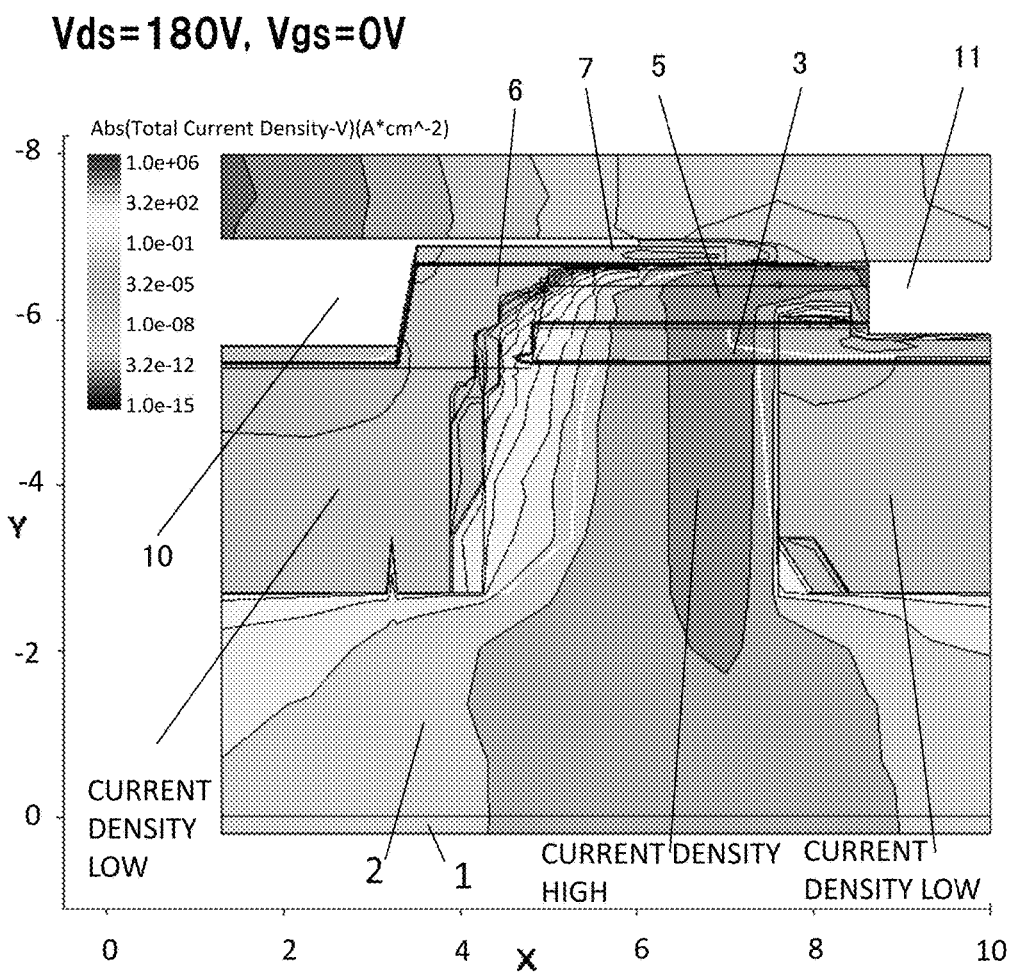
FIG. 4B is a drawing illustrating a current density profile (simulation) during dielectric breakdown according to the field effect transistor of sample B.

FIGS. 4A and 4B are drawings obtained by simulation of current density profiles during application of dielectric breakdown voltage for sample A and sample B. FIG. 4A is a drawing illustrating the current density profile related to the sample A, and FIG. 4B is a drawing illustrating the current density profile related to the sample B. The dielectric breakdown voltage of the sample A is 950 V and 180 V for sample B.

According to FIGS. 4A and 4B, it is evident that the current flows through the npn parasitic structure in the sample B. This indicates that the current flows by a parasitic bipolar transistor operating. Meanwhile, the current in the sample A flows in the pn diode, and it is possible to exclude the parasitic bipolar transistor. Accordingly, it is confirmed that it is possible for the vertical transistor of the disclosure to realize high breakdown voltage characteristics even in device simulation.

First Modification Example

A modification example of the field effect transistor of the first exemplary embodiment will be described below.

Figure 5:
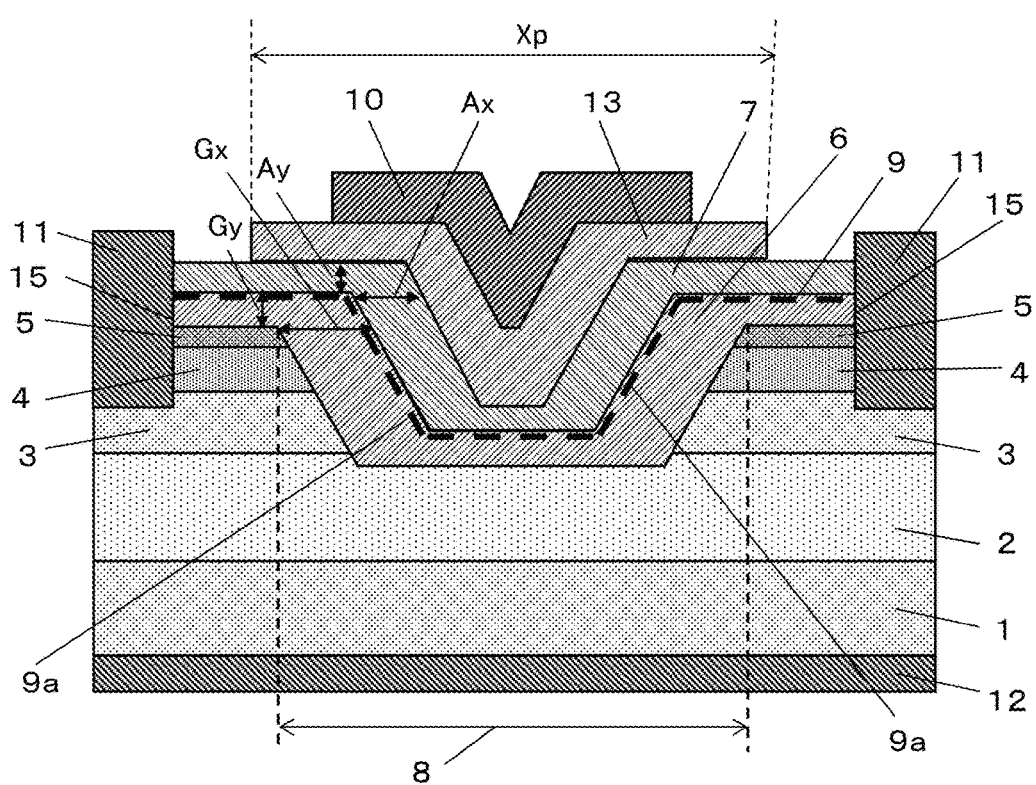
FIG. 5 is a cross-sectional view of a field effect transistor of a first modification example of the first exemplary embodiment.

FIG. 5 illustrates a cross-sectional view of the field effect transistor according to one modification example (first modification example). The field effect transistor of the modification example as illustrated in FIG. 5 has a configuration in which p-type semiconductor layer 13 is provided between third regrowth layer 7 and gate electrode 10. P-type semiconductor layer 13 is formed of Mg doped p-type $Al_{0.2}Ga_{0.8}N$ with a thickness of 100 nm and a carrier density of $1 \times 10^{17}$ cm$^{-3}$. When the width along the <1-100> direction of p-type semiconductor layer 13 is Xp, Xp=7 μm. Other configurations are the same as the field effect transistor illustrated in the first exemplary embodiment.

According to this configuration, because the conduction band edge potential of the channel portion rises due to p-type semiconductor layer 13, it is possible for the threshold to be increased, and it is possible to realize a normally off characteristics in the field effect transistor.

Second Modification Example

The second modification example of the field effect transistor according to the first exemplary embodiment has a configuration in which an insulating film formed of silicon nitride (SiN) is provided in the field effect transistor (FIG. 5) according to the first modification example, instead of p-type semiconductor layer 13. Xa, Xb, Xc, Gx, Gy, Ax, and Ay are the same as the first exemplary embodiment.

According to this configuration, because the conduction band edge potential of the channel portion rises due to the insulating film, it is possible for the threshold to be increased.

It is possible to use silicon dioxide ($SiO_2$) or silicon oxynitride (SiON) in addition to SiN as the insulating film.

Third Modification Example

Figure 6:
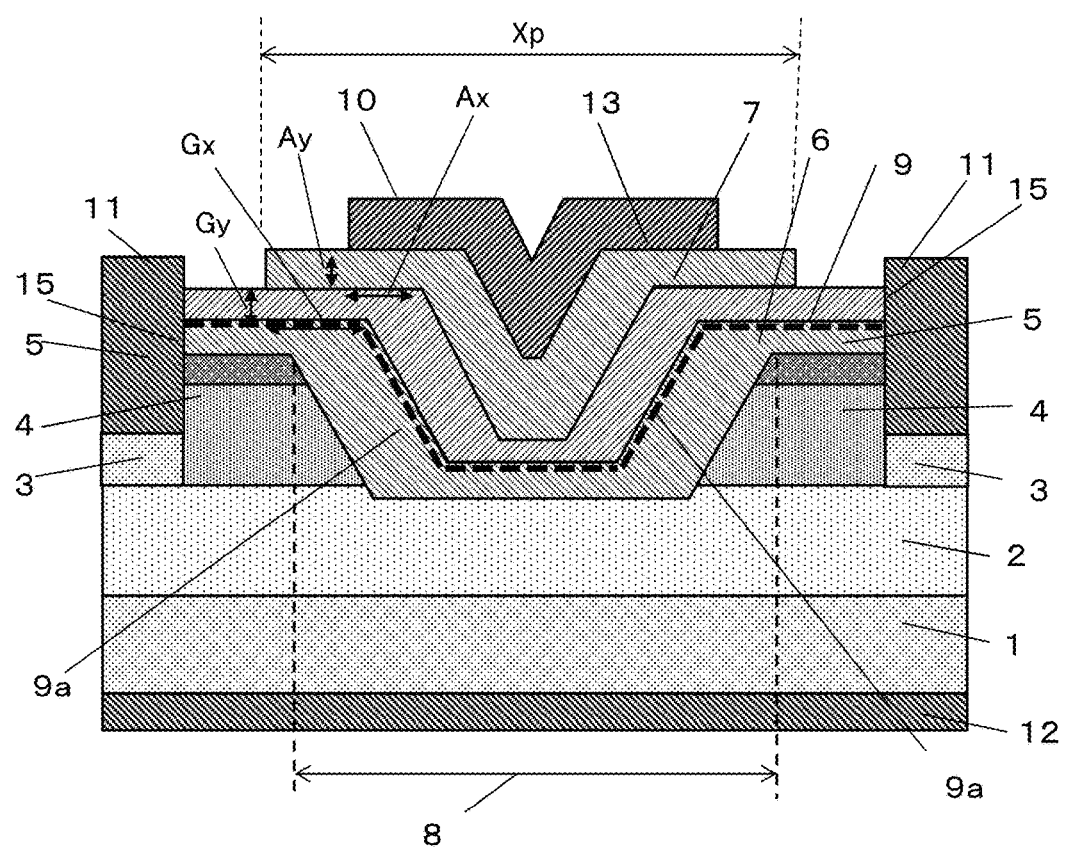
FIG. 6 is a cross-sectional view of a field effect transistor in a third modification example of the first exemplary embodiment.

The third modification example of the field effect transistor according to the first exemplary embodiment has a configuration in which first base layer 3 formed of p-type GaN in the field effect transistor (FIG. 5) according to the first modification example is provided limited to directly below source electrode 11, and other portions thereof are provided with second base layer 4 formed of semi-insulating GaN, as illustrated in FIG. 6. Xa, Xb, Xc, Gx, Gy, Ax, and Ay are the same as the first exemplary embodiment.

In doing so, the same effects as the first modification example are obtained.

Any material may be used for second base layer 4 as long as the material is an insulating layer or semi-insulating layer, and a GaN layer to which $3 \times 10^{17}$ cm$^{-3}$ or more and preferably $1 \times 10^{18}$ cm$^{-3}$ or more of C (carbon) is added may be used. There is no limitation to the GaN layer, and it is possible to use an AlN layer, an AlGaN layer, an InGaN layer, and an InAlGaN layer. It is preferable that the concentration of Si or O (oxygen) included in second base layer 4 be made lower than the concentration of C and, for example, $5 \times 10^{16}$ cm$^{-3}$ or less is preferable, and $2 \times 10^{16}$ cm$^{-3}$ or less is more preferable.

Second base layer 4 may be formed by ion injection of Mg, Fe, B and the like. If an ion species able to increase resistance is used, the same effects as the other ion species are obtained.

Fourth Modification Example

Figure 7:
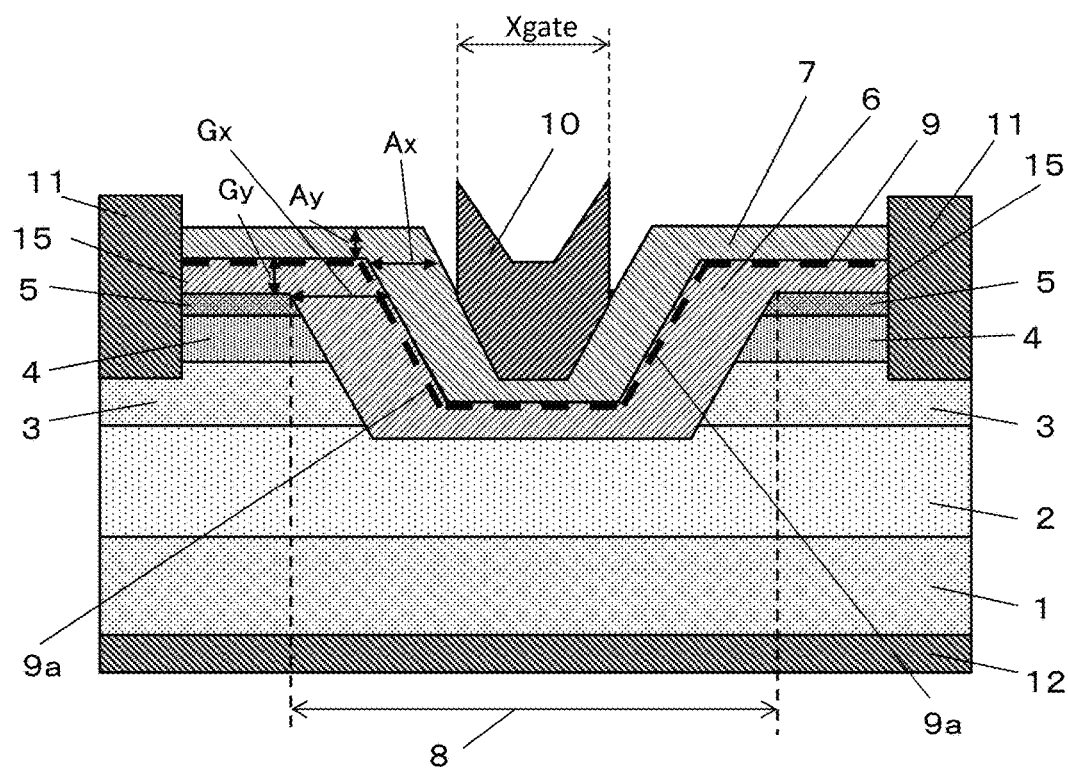
FIG. 7 is a cross-sectional view of a field effect transistor in a fourth modification example of the first exemplary embodiment.

FIG. 7 illustrates a cross-sectional view of the fourth modification example of the field effect transistor according to the first exemplary embodiment. The field effect transistor has a configuration in which gate electrode 10 is disposed on the inside of gate opening 8 as illustrated in FIGS. 4A and 4B in contrast to the field effect transistor illustrated in FIG. 1, and Xgate=3 μm. Xa, Xb, Xc, Gx, Gy, Ax, and Ay are the same as the first exemplary embodiment.

By doing so, for the field effect transistor, since it is possible to limit the region of two-dimensional electron gas layer 9, which is a channel controlled by applying a voltage to gate electrode 10, to the vicinity of the bottom surface of gate opening 8, it is possible to make the pinch off voltage of the field effect transistor more stable.

Fifth Modification Example

Figure 8:
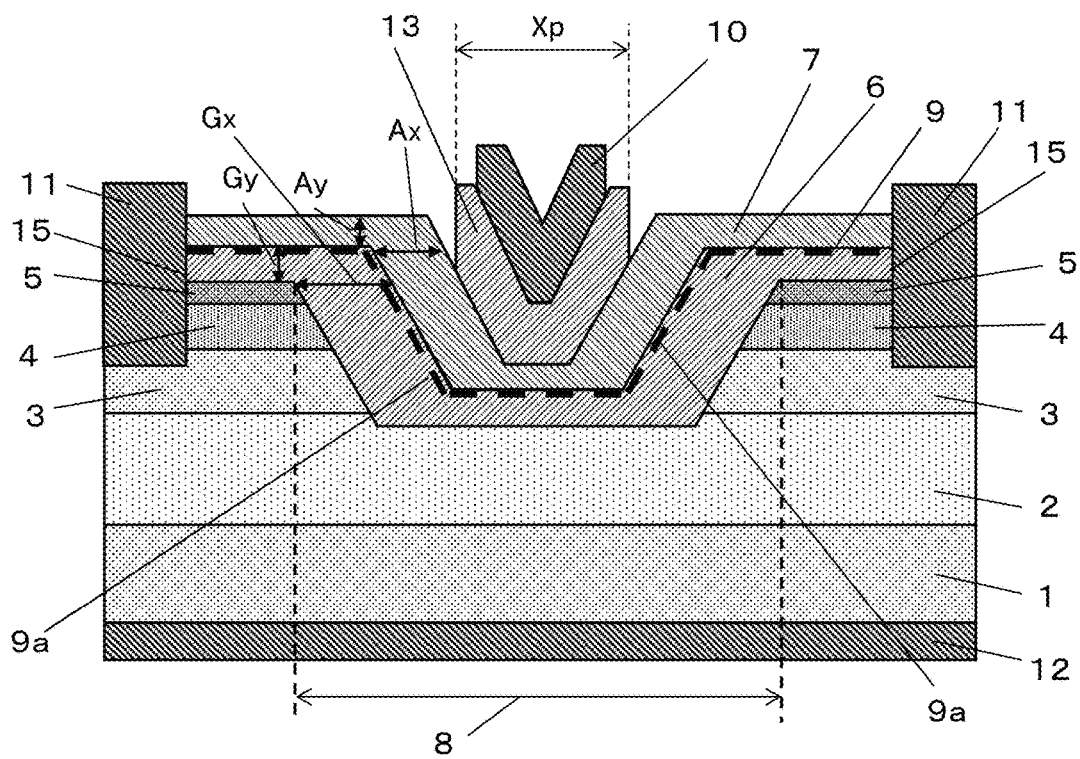
FIG. 8 is a cross-sectional view of a field effect transistor in a fifth modification example of the first exemplary embodiment.

FIG. 8 illustrates a cross-sectional view of the fifth modification example of the field effect transistor according to the first exemplary embodiment. The field effect transistor has a configuration in which gate electrode 10 and p-type semiconductor layer 13 are disposed on the inside of gate opening 8 as illustrated in FIG. 8, in contrast to the field effect transistor illustrated in the first modification example (FIG. 5). Here, Xp=3 μm, and Xgate=2 μm. Xa, Xb, Xc, Gx, Gy, Ax, and Ay are the same as the first exemplary embodiment.

According to the configuration, similarly to the field effect transistor according to the fourth modification example (FIG. 7), for the field effect transistor, since it is possible to limit the region of two-dimensional electron gas layer 9, which is a channel controlled by applying a voltage to gate electrode 10, to the vicinity of the bottom surface of gate opening 8, it is possible to make the pinch off voltage of the field effect transistor more stable.

Sixth Modification Example

The sixth modification example of the field effect transistor according to the first exemplary embodiment has a configuration in which an insulating film formed of silicon nitride (SiN) is provided instead of p-type semiconductor layer 13 in the field effect transistor (FIG. 8) according to the fifth modification example. Xa, Xb, Xc, Gx, Gy, Ax, and Ay are the same as the first exemplary embodiment.

According to the configuration, similarly to the field effect transistor according to the fourth modification example (FIG. 7), for the field effect transistor, since it is possible to limit the region of two-dimensional electron gas layer 9, which is a channel controlled by applying a voltage to gate electrode 10, to the vicinity of the bottom surface of gate opening 8, it is possible to make the pinch off voltage of the field effect transistor more stable. According to this configuration, because the conduction band edge potential of the channel portion rises due to the insulating film, it is possible for the threshold to be increased.

It is possible to use silicon dioxide ($SiO_2$) or silicon oxynitride (SiON) in addition to SiN as the insulating film.

When Mg is diffused as far as the vicinity of the channel, the carrier density of two-dimensional electron gas layer 9 that is a channel is lowered, thereby increasing the on-resistance. Here, third base layer 5 is provided in the first exemplary embodiment, and third base layer 5 is caused to act as a diffusion preventing layer that suppresses the diffusion of Mg from first base layer 3 to the channel. Third base layer 5 can also use InAlN or InAlGaN as the diffusion preventing layer.

Although first base layer 3 is stipulated as undoped in the first exemplary embodiment, n-type doping can also be used. By using n-type doping, because the depletion layer from third base layer 5 does not easily extend upward, the channel becomes not easily constricted, thereby the on-resistance can be reduced.

The crystal growth conditions which promote growth in the horizontal direction upon preparing the field effect transistor in the first exemplary embodiment may be used and the crystal growth speed in a direction parallel to substrate 1 may be improved to be better than that in the direction perpendicular to substrate 1.

Seventh Modification Example

The seventh modification example of the field effect transistor according to the first exemplary embodiment is an example in which so-called finger structures are arranged instead of the arrangement of the field effect transistor illustrated in FIGS. 2A and 2B.

Figure 9:
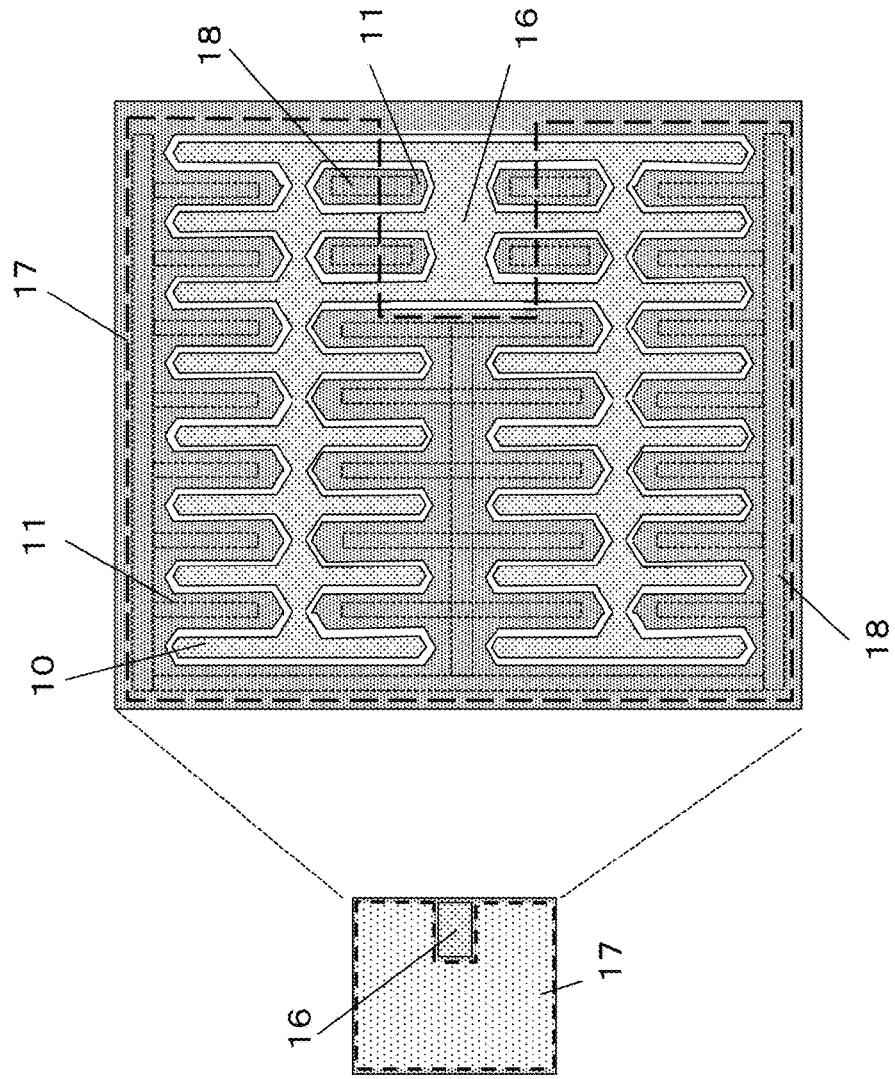
FIG. 9A is a top view illustrating a schematic view of all elements of the field effect transistor of a seventh modification example of the first exemplary embodiment.
FIG. 9B is a top view illustrating a schematic view of electrode placement of the field effect transistor of a seventh modification example of the first exemplary embodiment.

FIGS. 9A and 9B are drawings illustrating the element placement in the field effect transistor of the modification example, FIG. 9A is a drawing illustrating all elements of the field effect transistor, and FIG. 9B is a drawing illustrating the electrode placement in the elements. The structure having the electrode placement in FIG. 9B is a so-called finger structure.

The field effect transistor according to the modification example is provided so that groove-like contact hole 18 instead of second opening 15 is filled by source electrode 11. Gate electrode 10 and source electrode 11 are provided in parallel to one another and the length direction of gate electrode 10 and source electrode 11 is the <11-20> direction.

As illustrated in FIGS. 9A and 9B, gate electrode 10 is electrically connected to gate pad 16, source pad 17, the region of which is indicated by the broken line, is formed on the insulating layer (not shown) formed on gate electrode 10. A hole (not shown) is provided in the insulating layer and source electrode 11 and source pad 17 are electrically connected via the hole.

The element arrangement of the field effect transistor is not limited to the arrangement illustrated in FIGS. 2A, 2B, 9A and 9B, and can be a linear arrangement or a circular arrangement.

Second Exemplary Embodiment

Figure 10:
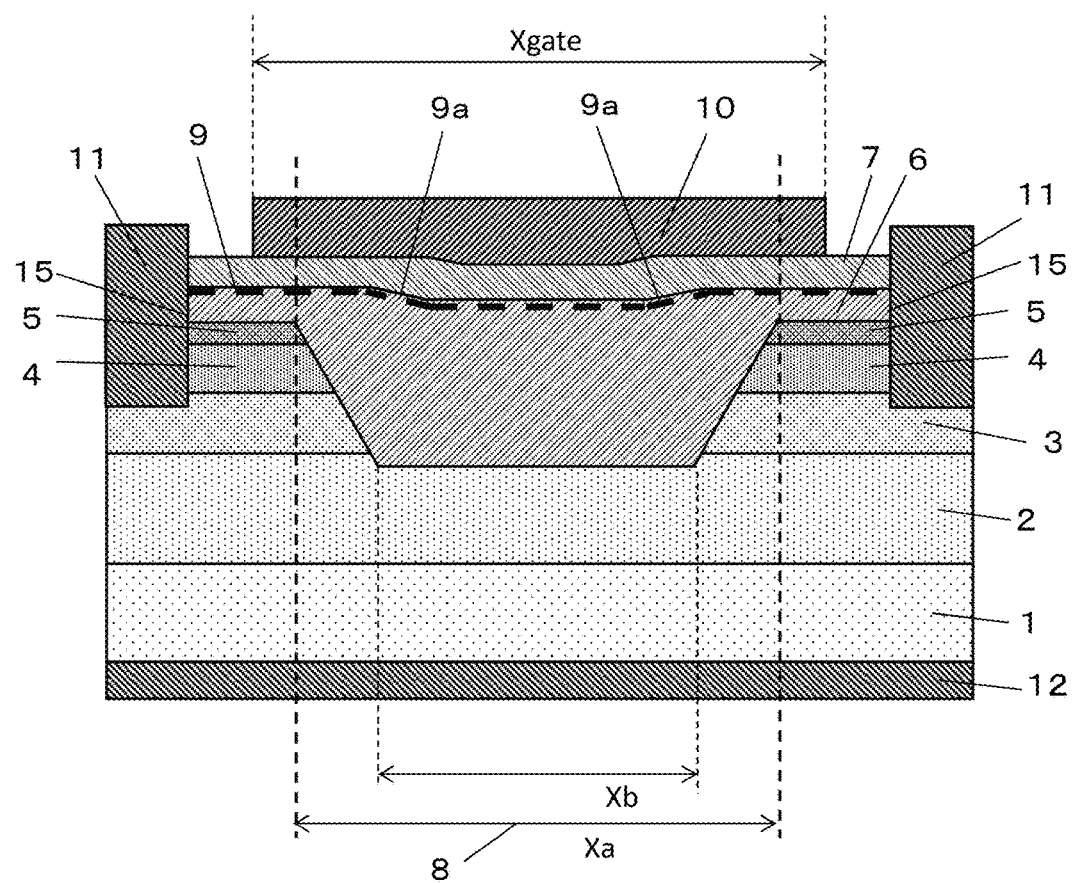
FIG. 10 is a cross-sectional view of a field effect transistor of a second exemplary embodiment.

FIG. 10 illustrates a cross-sectional view of the field effect transistor in the second exemplary embodiment according to the disclosure. The point of difference between the field effect transistor of the disclosure illustrated in the exemplary embodiment and the field effect transistor in the first exemplary embodiment is that the width of gate opening 8 is greater than the width of gate opening 8 of the filed effect transistor in the first exemplary embodiment. Specifically, when the opening width of gate opening 8 of the field effect transistor in the second exemplary embodiment is Xa and the width of the bottom portion of gate opening 8 is Xb, Xa=6.4 µm and the Xb=5 µm. When done, Gx=3 µm, and Gy=0.1 µm. That is, $$Gx >> Gy \qquad \text{Formula 3}$$

is satisfied. Even though a shallow depression remains slightly in the surface of first regrowth layer 6 and the second regrowth layer, the surface is substantially flat.

The other configurations are the same as the configuration illustrated by the first exemplary embodiment.

By doing so, it is possible to lengthen the distance between inclined carrier region 9a formed facing side wall 8a of gate opening 8 and first base layer 3, thereby suppressing a lowering of the sheet carrier density in inclined carrier region 9a. For the interface formed between first regrowth layer 6 and the second regrowth layer, the angle with respect to the main surface of the surface that forms an incline with the main surface becomes less than θ which is the angle formed with the main surface of the side surface of gate opening 8. Accordingly, lowering of the density of two-dimensional electron gas layer 9, and, in particular, inclined carrier region 9a, in which the interface formed between first regrowth layer 6 and the second regrowth layer arises is suppressed. As a result, it is possible for the resistance of two-dimensional electron gas layer 9 to be reduced and for the on-resistance of the field effect transistor to be reduced.

Each semiconductor layer which forms the field effect transistor is formed by MOVPE. Gate opening 8 is formed by dry etching. The MOVPE conditions related to first regrowth layer 6, the second regrowth layer, and third regrowth layer 7 after gate opening 8 is formed are denoted in Table 3.

TABLE 3

| | Raw Material Gas | Flow Rate | Crystal Growth Temperature |
|---|---|---|---|
| First Regrowth Layer 6 | TMG | 15 sccm | 1050° C. |
| | Ammonia | 30 slm | |
| Second Regrowth Layer | TMA | 20 sccm | 1100° C. |
| | Ammonia | 30 slm | |
| Third Regrowth Layer 7 | TMG | 15 sccm | 1100° C. |
| | TMA | 20 sccm | |
| | Ammonia | 30 slm | |

In Table 3, TMG represents trimethyl gallium, and TMA represents trimethyl aluminum. sccm and slm are the units of the flow rate of gas that flows per minute when converted to standard conditions (0° C., 1 atmosphere), 1 sccm is the flow rate of 1 cm³ of gas in one minute, and 1 slm is the flow rate of one litre of gas in one minute.

In MOVPE, point of difference with the first exemplary embodiment is the growth time. When the crystal growth proceeds along the main surface of substrate 1 by extending the regrowth time in the exemplary embodiment, that is, the growth in the horizontal direction is promoted, it is possible to reduce the angle with respect to the main surface of the surface that forms an incline with the main surface to less than θ which is the angle formed with the main surface of the side surface of gate opening 8 for the interface formed between first regrowth layer 6 and the second regrowth layer.

First Modification Example

A modification example of the field effect transistor according to the second exemplary embodiment will be described below.

Figure 11:
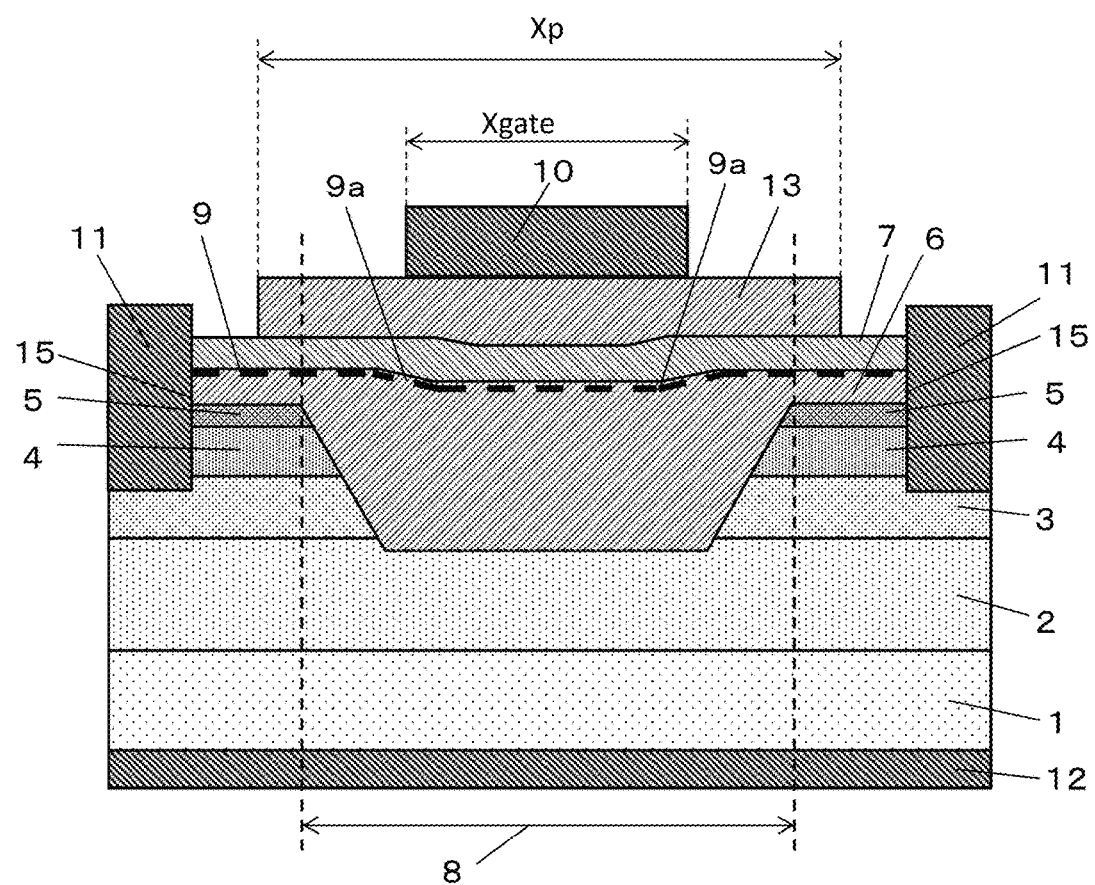
FIG. 11 is a cross-sectional view of a field effect transistor of a first modification example of the second exemplary embodiment.

FIG. 11 illustrates a cross-sectional view of the field effect transistor according to one modification example (first modification example). The field effect transistor of the modification example as illustrated in FIG. 11 has a configuration in which p-type semiconductor layer 13 is provided between third regrowth layer 7 and gate electrode 10. P-type semiconductor layer 13 is formed of Mg doped p-type $Al_{0.2}Ga_{0.8}N$ with a thickness of 100 nm and a carrier density of $1\times10^{17}$ cm$^{-3}$. For the gate electrode 10, when Xgate=7 µm, and the width along the <1-100> direction of p-type semiconductor layer 13 is Xp, Xp=5 µm. Other configurations are the same as the field effect transistor illustrated in the second exemplary embodiment.

According to this configuration, because the conduction band edge potential of the channel portion rises due to p-type semiconductor layer 13, it is possible for the threshold to be increased, and it is possible to realize normally off characteristics in the field effect transistor.

Second Modification Example

The second modification example of the field effect transistor according to the second exemplary embodiment of the disclosure has a configuration in which an insulating film formed of silicon nitride (SiN) is provided instead of p-type semiconductor layer 13 in the field effect transistor (FIG. 11) according to the first modification example.

According to this configuration, because the conduction band edge potential of the channel portion rises due to the insulating film, it is possible for the threshold to be increased.

It is possible to use silicon dioxide ($SiO_2$) or silicon oxynitride (SiON) in addition to SiN as the insulating film.

Third Modification Example

Figure 12:
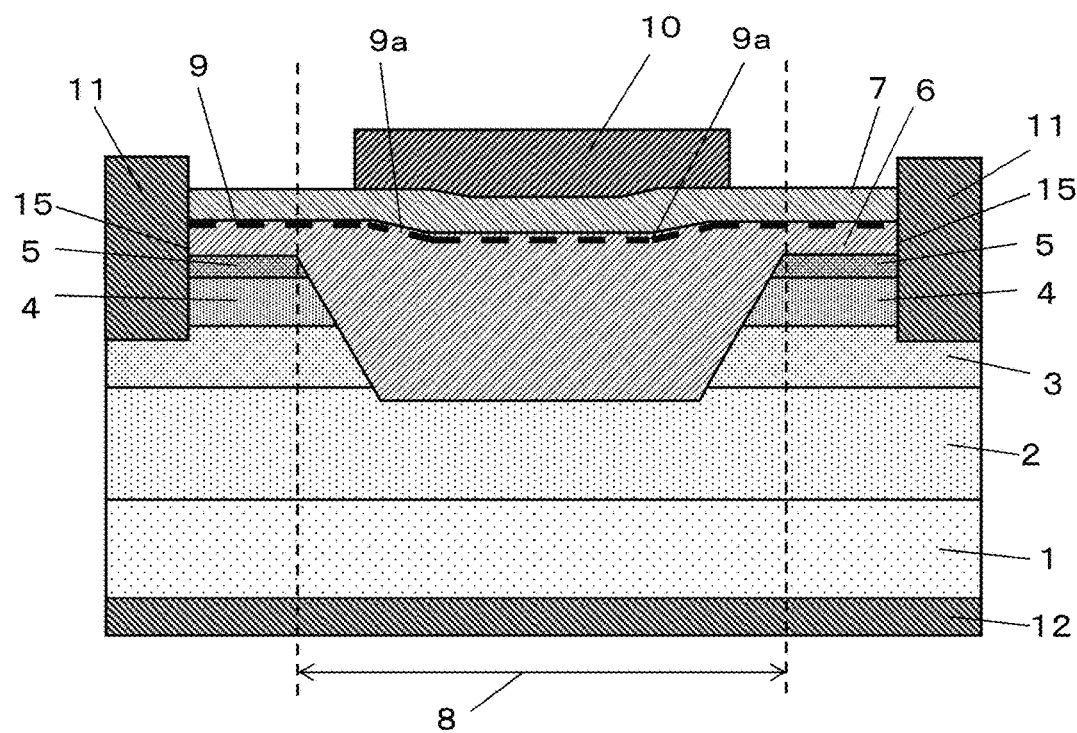
FIG. 12 is a cross-sectional view of a field effect transistor in a third modification example of the second exemplary embodiment.

FIG. 12 illustrates a cross-sectional view of the third modification example of the field effect transistor in the second exemplary embodiment of the disclosure. The field effect transistor has a configuration in which gate electrode 10 is disposed on the inside of gate opening 8 as illustrated in FIG. 12, in contrast to the field effect transistor according to the second exemplary embodiment, and Xgate=5 µm. Xa, Xb, and Xc are the same as the second exemplary embodiment.

By doing so, for the field effect transistor, since it is possible to limit the region of two-dimensional electron gas layer 9, which is a channel controlled by applying a voltage to gate electrode 10, to the vicinity of the bottom surface of gate opening 8, it is possible to make the pinch off voltage of the field effect transistor more stable.

Fourth Modification Example

Figure 13:
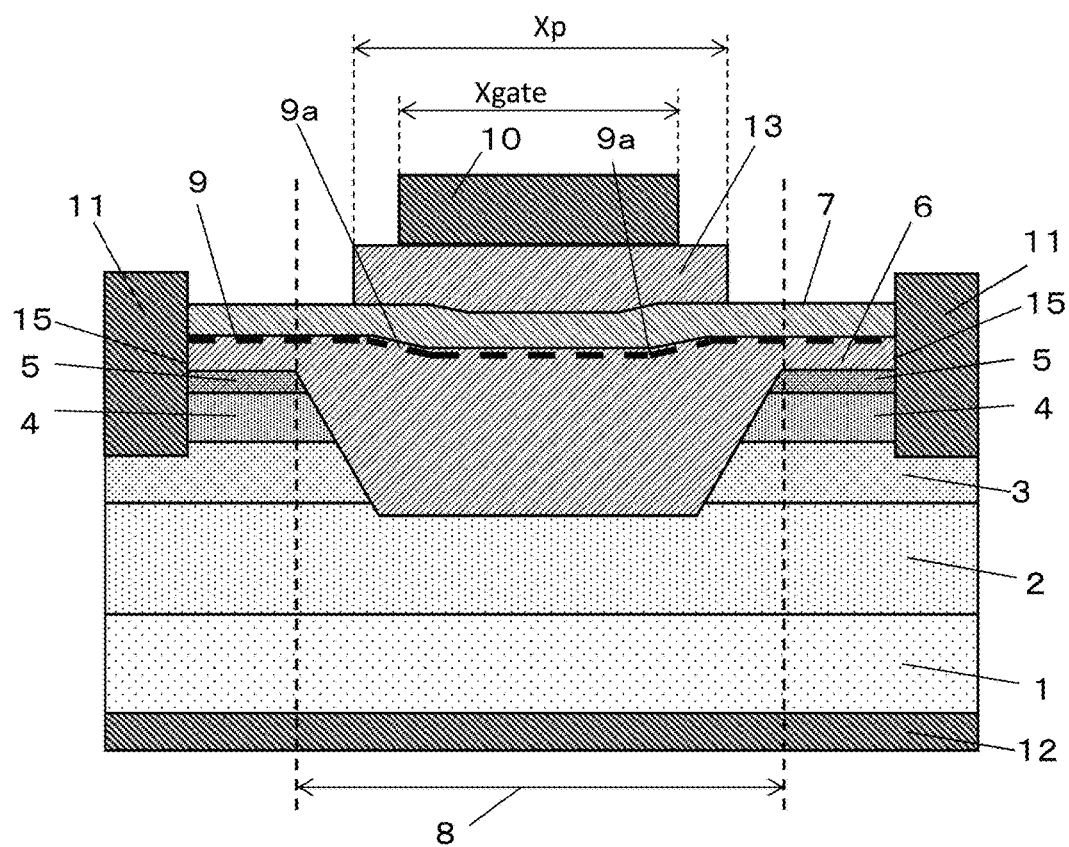
FIG. 13 is a cross-sectional view of a field effect transistor in a fourth modification example of the second exemplary embodiment.

FIG. 13 illustrates a cross-sectional view of the fourth modification example of the field effect transistor in the second exemplary embodiment of the disclosure. The field effect transistor has a configuration in which gate electrode 10 and p-type semiconductor layer 13 are disposed on the inside of gate opening 8 as illustrated in FIG. 13, in contrast to the field effect transistor illustrated in the first modification example (FIG. 11). Here, Xp=5 μm and Xgate=3 μm. Xa, Xb, and Xc are the same as the second exemplary embodiment.

According to the configuration, similarly to the field effect transistor according to the third modification example (FIG. 12), for the field effect transistor, since it is possible to limit the region of two-dimensional electron gas layer 9, which is a channel controlled by applying a voltage to gate electrode 10, to the vicinity of the bottom surface of gate opening 8, it is possible to make the pinch off voltage of the field effect transistor more stable.

Fifth Modification Example

The fifth modification example of the field effect transistor according to the second exemplary embodiment of the disclosure has a configuration in which an insulating film formed of silicon nitride (SiN) is provided instead of p-type semiconductor layer 13 in the field effect transistor (FIG. 13) according to the fourth modification example.

According to the configuration, similarly to the field effect transistor according to the third modification example (FIG. 12), for the field effect transistor, since it is possible to limit the region of two-dimensional electron gas layer 9, which is a channel controlled by applying a voltage to gate electrode 10, to the vicinity of the bottom surface of gate opening 8, it is possible to make the pinch off voltage of the field effect transistor more stable. According to this configuration, because the conduction band edge potential of the channel portion rises due to the insulating film, it is possible for the threshold to be increased.

It is possible to use silicon dioxide ($SiO_2$) or silicon oxynitride ($SiON$) in addition to SiN as the insulating film.

Providing third base layer 5 and causing third base layer 5 to act as a diffusion preventing layer which suppresses the diffusion of Mg from first base layer 3 to the channel are the same as in the first exemplary embodiment. Third base layer 5 can also use InAlN or InAlGaN as the diffusion preventing layer.

Although first base layer 3 is stipulated as undoped in the first exemplary embodiment, n-type doping can also be used. By using n-type doping, because the depletion layer from third base layer 5 does not easily extend upward, the channel becomes not easily constricted, thereby the on-resistance can be reduced.

In the second exemplary embodiment, it goes without saying that the placement illustrated in FIGS. 2A, 2B and 6 is possible for the element placement of the field effect transistor.

In the first and second exemplary embodiments, the constitution and layer thickness of each semiconductor layer are not limited to those in Table 1, and it is possible to select, as appropriate, the constitution or layer thickness based on the conception according to the disclosure.

In the first and second exemplary embodiments, the raw material gas, gas flow rate, and the crystal growth temperature of first regrowth layer 6, the second regrowth layer, and third regrowth layer 7 are not limited to those in the Table 2, and it is possible for these conditions to be modified, as appropriate, by modification or the like of the constitution.

When the angle formed with the main surface of the side surface of gate opening 8 is θ, although θ=45 degrees in the first and second exemplary embodiments, there is no limitation to this angle. When Gx>Gy is taken into consideration, it is preferable that θ≤45 degrees in order to obtain a greater Gx.

Third Exemplary Embodiment

Figure 14:
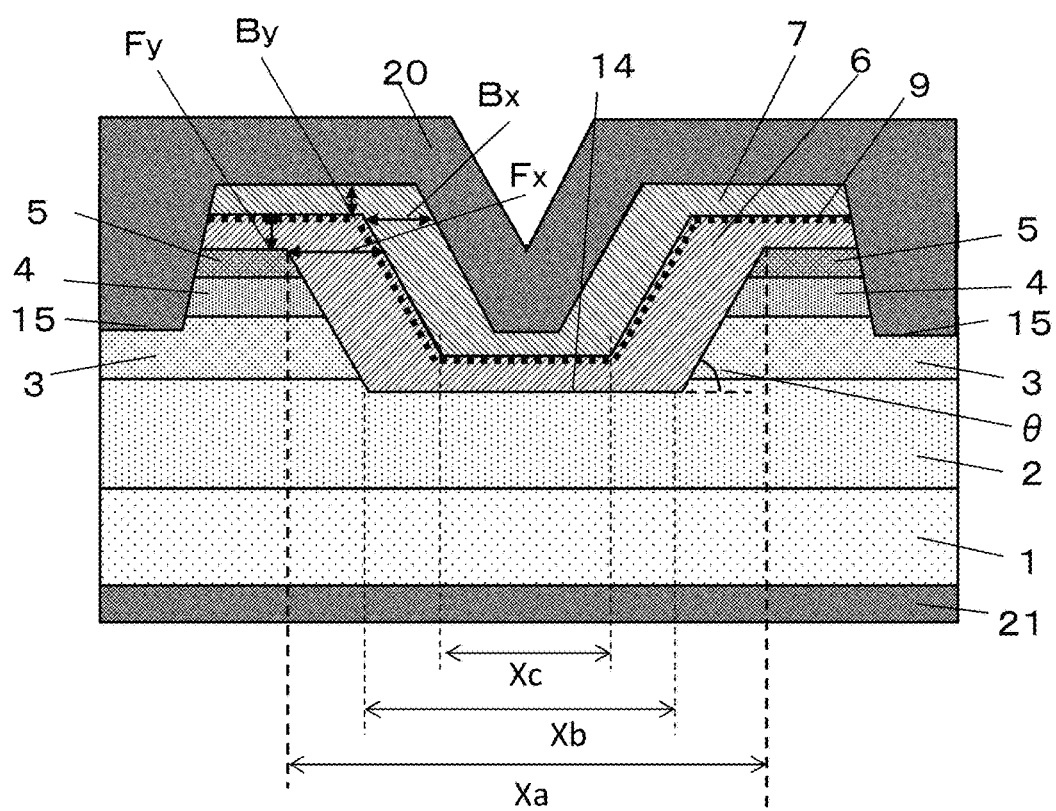
FIG. 14 is a cross-sectional view of a nitride semiconductor device of a third exemplary embodiment.

FIG. 14 illustrates a cross-sectional view of the nitride semiconductor device of the third exemplary embodiment of the disclosure. The exemplary embodiment modifies the transistor of the first exemplary embodiment to a diode. As illustrated in FIG. 14, in the nitride semiconductor device of the exemplary embodiment, drift layer 2 formed of n-type GaN with a thickness of 8 μm, first base layer 3 formed of p-type GaN with a thickness of 400 nm, and second base layer 4 formed of undoped $Al_{0.2}Ga_{0.8}N$ with a thickness of 200 nm are formed in this order on substrate 1 formed of n+-type GaN with a thickness of 300 μm, the main surface of which is made the C-plane ((0001) plane). First opening 14 that reaches drift layer 2 passing through each GaN-based semiconductor layer is formed on second base layer 4. Si is added to drift layer 2, and the donor concentration is made $1 \times 10^{16}$ $cm^{-3}$. Mg is added to first base layer 3, and the acceptor density becomes $1 \times 10^{19}$ $cm^{-3}$.

First regrowth layer 6 formed of undoped GaN with a thickness of 100 nm which is formed by regrowth to cover first opening 14, a second regrowth layer formed of undoped AlN with a thickness of 1 nm, not shown, and third regrowth layer 7 formed of undoped $Al_{0.2}Ga_{0.8}N$ with a thickness of 50 nm are formed in this order.

Two-dimensional electron gas layer 9 is formed at the interface between first regrowth layer 6 and the second regrowth layer, and two-dimensional electron gas layer 9 forms an electron transit layer (channel layer) of the nitride semiconductor device.

After forming third regrowth layer 7, second opening 15 which reaches first base layer 3 is formed on third regrowth layer 7 separated from first opening 14. Anode electrode 20 formed of Pd is formed to cover first opening 14 and second opening 15, and two-dimensional electron gas layer 9 and anode electrode 20 come into electrical contact in second opening 15.

The main surface of each semiconductor layer formed on substrate 1 is the C-plane.

The layer structure of the nitride semiconductor apparatus is summarized in the following Table 4.

TABLE 4

| | Constitution | Layer Thickness | Conductivity Type | Carrier density ($cm^{-3}$) |
|---|---|---|---|---|
| Substrate 1 | GaN | 300 μm | n | $1 \times 10^{19}$ |
| Drift Layer 2 | GaN | 8 μm | n | $1 \times 10^{16}$ |
| First Base Layer 3 | GaN | 400 nm | p | $1 \times 10^{17}$ |
| Second Base Layer 4 | GaN | 200 nm | Undoped | — |
| Third Base Layer 5 | $Al_{0.2}Ga_{0.8}N$ | 20 nm | Undoped | — |
| First Regrowth Layer 6 | GaN | 100 nm | Undoped | — |
| Second Regrowth Layer | AlN | 1 nm | Undoped | — |
| Third Regrowth Layer 7 | $Al_{0.2}Ga_{0.8}N$ | 50 nm | Undoped | — |

When the opening width of first opening 14 is Xa, the width of the bottom portion of first opening 14 is Xb, and the width of the bottom surface directly below anode electrode 20 when first regrowth layer 6 is formed is Xc, the relationships Xa=6.4 μm, Xb=5 μm, and Xc=2 μm are satisfied. When the angle of the side surface of first opening 14 formed with the main surface is θ, θ=45 degrees.

Each semiconductor layer which forms the diode is formed by metal organic vapor phase epitaxy (referred to below as MOVPE). First opening 14 and second opening 15 are formed by dry etching. The MOVPE conditions related to first regrowth layer 6, the second regrowth layer, and third regrowth layer 7 after first opening 14 is formed are denoted in Table 5.

TABLE 5

|  | Raw Material Gas | Flow Rate | Crystal Growth Temperature |
|---|---|---|---|
| First Regrowth Layer 6 | TMG | 15 sccm | 1050° C. |
|  | Ammonia | 30 slm |  |
| Second Regrowth Layer | TMA | 20 sccm | 1100° C. |
|  | Ammonia | 30 slm |  |
| Third Regrowth Layer 7 | TMG | 15 sccm | 1100° C. |
|  | TMA | 20 sccm |  |
|  | Ammonia | 30 slm |  |

In Table 5, TMG represents trimethyl gallium, and TMA represents trimethyl aluminum. sccm and slm are the units of the flow rate of gas that flows per minute when converted to standard conditions (0° C., 1 atmosphere), 1 sccm is the flow rate of 1 cm$^3$ of gas in one minute, and 1 slm is the flow rate of one litre of gas in one minute.

Inserting a block layer in the diode to which the PN diode using the Schottky diode and the bulk layer which use the two-dimensional electron gas is connected in parallel, and excluding the npn parasitic bipolar structure are a feature of the disclosure. In so doing, it is possible to suppress a lowering of the breakdown voltage due to misoperation of the parasitic bipolar structure and realize an increased breakdown voltage in the diode.

When the thickness of first regrowth layer 6 in the <1-100> direction is Fx and the thickness in the <0001> direction (direction perpendicular to the main surface of substrate 1) is Fy, since Fx=1.5 μm and Fy=0.1 μm in the field effect transistor of the disclosure, it is evident that $$Fx > Fy \qquad \text{Formula 4}$$

is satisfied. By doing so, it is possible to lengthen the distance between the inclined carrier region of two-dimensional electron gas layer 9 and first base layer 3 formed facing the side wall of first opening 14, thereby suppressing a lowering of the sheet carrier density of the inclined carrier region, and, as a result, it is possible for the resistance of two-dimensional electron gas layer 9 to be lowered, and for the resistance of the channel of the nitride semiconductor device to be lowered.

For the diode of the disclosure, by lengthening the distance between the inclined carrier region and first base layer 3 due to determining the values of Fx and Fy as in the formula (Equation 4), the distance between first base layer 3 and the inclined carrier region is lengthened and the influence of the spreading of the depletion layer on inclined carrier region 9a is reduced. In doing so, it is possible to reduce the resistance of two-dimensional electron gas layer 9.

Although second opening 15 for establishing contact with first base layer 3 formed of p-type GaN is provided on anode electrode 20, it is possible to reduce the depth of first opening 14 and the depth of second opening 15 as the layer thickness of first regrowth layer 6 in the flat section becomes thinner. It is possible to reduce the processing time as the depth of first opening 14 becomes thinner, and the coverage of anode electrode 20 also becomes favorable.

As first regrowth layer 6, the second regrowth layer, and third regrowth layer 7 are grown on first opening 14, the width of the recessed section formed on first opening 14 is reduced.

Generally, upon growing third regrowth layer 7 on first opening 14, the crystal growth speed in the side wall of first opening 14 and the crystal growth speed in the main surface direction are different, and since the incorporation rate of Al increases as the crystal growth speed reduces, the Al constitution of third regrowth layer 7 increases.

As the Al constitution of third regrowth layer 7 increases, the difference in the lattice constants between third regrowth layer 7 and first regrowth layer 6 increases, thereby increasing the polarization, and the sheet carrier density of two-dimensional electron gas layer 9 increases. Therefore, the resistance of two-dimensional electron gas layer 9 is reduced.

Since it is evident from the above-described research that the sheet carrier density in the inclined carrier region from two-dimensional electron gas layer 9 is reduced, in order for the sheet carrier density in the inclined carrier region to be increased, the crystal growth speed in the side wall of first opening 14 may be reduced to less than the crystal growth speed in the main surface direction and the Al constitution of third regrowth layer 7 that faces the side wall may be increased.

When the thickness in the <1-100> direction of third regrowth layer 7 is Bx and the thickness of the <0001> direction (direction perpendicular to the main surface of substrate 1) is By, and, based on this knowledge, Bx=60 nm and By=50 nm in the diode of the disclosure, the relationship $$Bx < By \qquad \text{Formula 5}$$

is satisfied. By doing so, the sheet carrier density is increased in the inclined carrier region, and, as a result, it is possible for the resistance in two-dimensional electron gas layer 9 to be reduced, and for the resistance when a bias is applied to anode electrode 20, that is, the on-resistance, to be reduced.

First Modification Example

Figure 15:
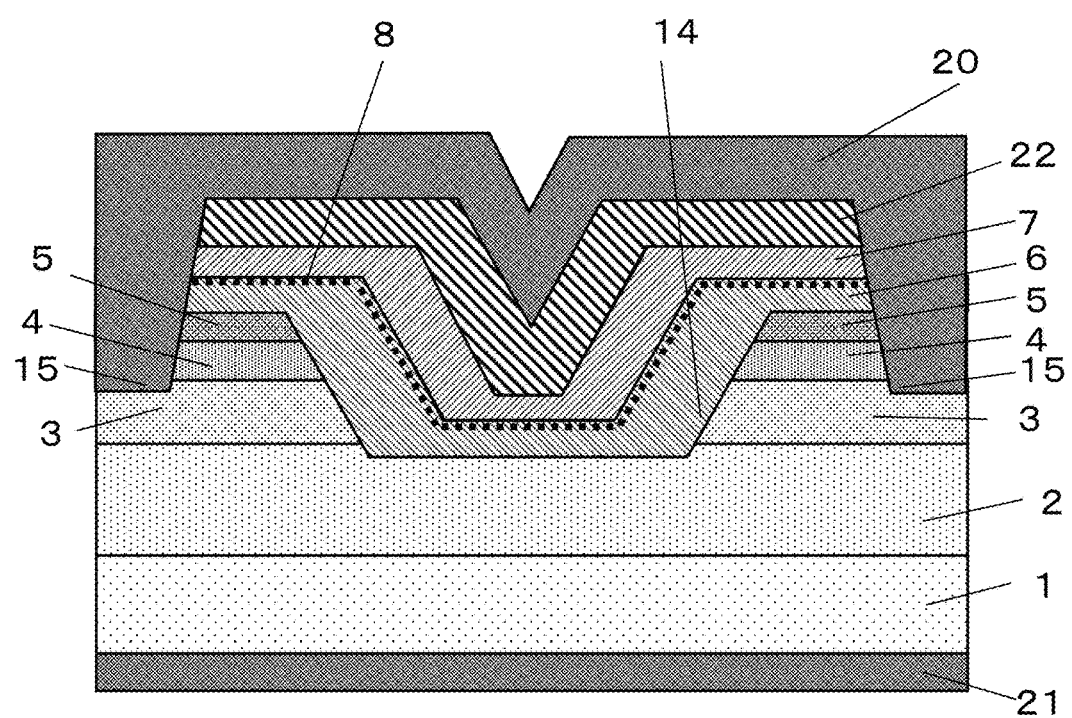
FIG. 15 is a cross-sectional view of a nitride semiconductor device of a first modification example of the third exemplary embodiment.

FIG. 15 illustrates a cross-sectional view related to the first modification example of the nitride semiconductor device in the third exemplary embodiment of the disclosure.

The difference between the nitride semiconductor device illustrated in FIG. 15 and the nitride semiconductor device illustrated in FIG. 14 is the feature of providing fourth regrowth layer 22 formed of p-type GaN with a thickness of 200 nm between anode electrode 20 and third regrowth layer 7. Other configurations are the same as the nitride semiconductor device illustrated in FIG. 14.

According to this configuration, when the voltage of anode electrode 20 is 0 V, that is, a zero bias, two-dimensional electron gas layer 9 is depleted by the depletion layer which extends due to fourth regrowth layer 22, and it is possible to reduce the leakage current of the portion at which anode electrode 20 and two-dimensional electron gas layer 9 come into contact.

Fourth Exemplary Embodiment

Figure 16:
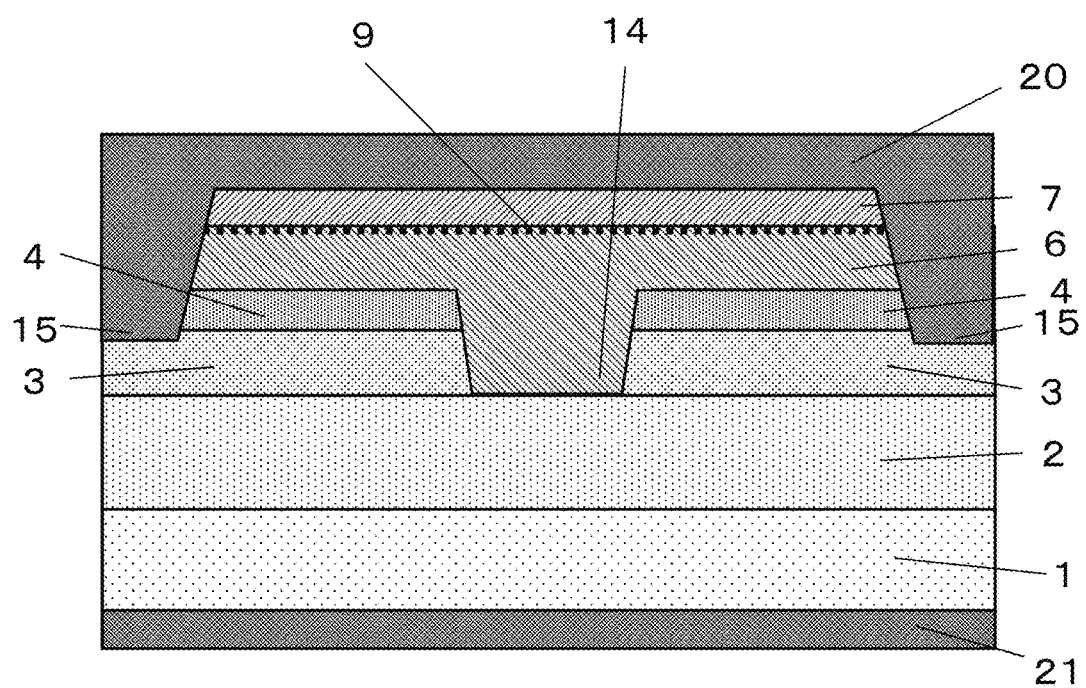
FIG. 16 is a cross-sectional view of a nitride semiconductor device in a fourth exemplary embodiment.

FIG. 16 illustrates a cross-sectional view of the nitride semiconductor device of the fourth exemplary embodiment of the disclosure. The nitride semiconductor is a diode. It is possible to consider a case where the layer thickness along the (0001) plane of first regrowth layer 6 in the third exemplary embodiment is extremely large. By sufficiently lengthening the growth time of first regrowth layer 6, first opening 14 is covered by first regrowth layer 6, and first regrowth layer 6 becomes substantially flat.

The layer thickness of first regrowth layer 6 is 0.3 μm in first opening 14.

The layer thickness of each semiconductor layer other than first regrowth layer 6 and the conditions of each electrode are as illustrated in the Table 4.

According to the configuration, it is possible to make two-dimensional electron gas layer 9 formed between first regrowth layer 6 and the second regrowth layer substantially flat and parallel to the C-plane, and to suppress a reduction in the sheet carrier density of two-dimensional electron gas layer 9.

According to the configuration, it is possible for the Schottky junction in which electric field concentration is avoided as much as possible to move to a location with less electric field concentration. Accordingly, it is possible to increase the breakdown voltage of the nitride semiconductor device.

First Modification Example

Figure 17:
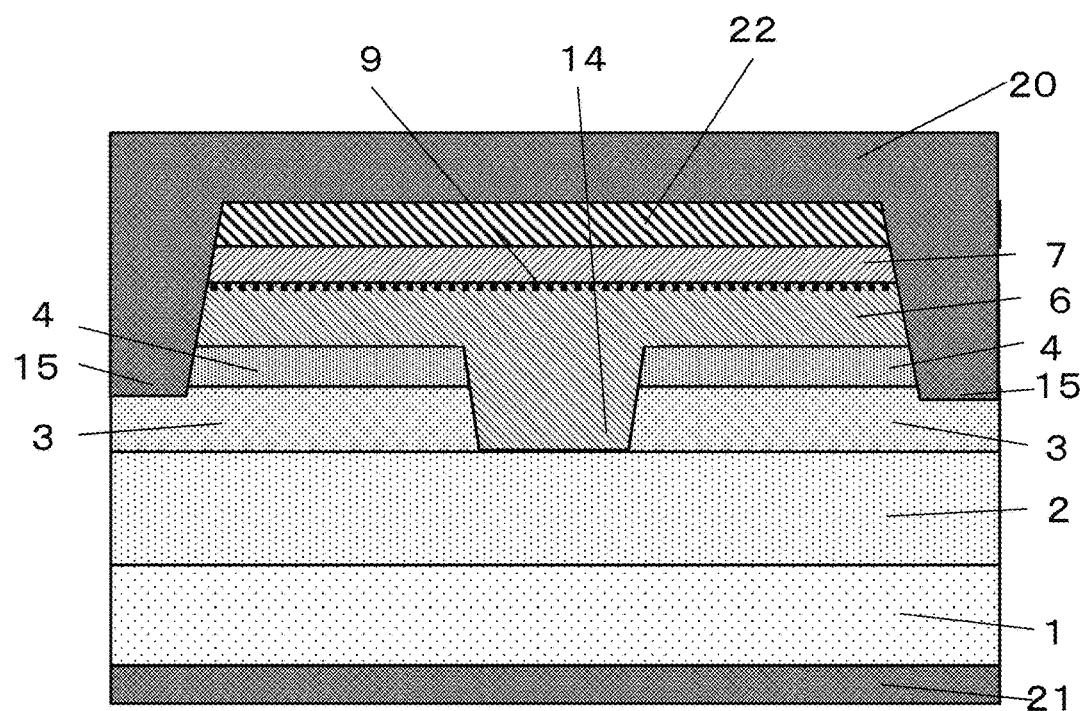
FIG. 17 is a cross-sectional view of a nitride semiconductor device of a first modification example of the fourth exemplary embodiment.

FIG. 17 illustrates a cross-sectional view related to the first modification example of the nitride semiconductor device of the fourth exemplary embodiment of the disclosure.

The difference between the nitride semiconductor device illustrated in FIG. 17 and the nitride semiconductor device illustrated in FIG. 14 is the feature of providing fourth regrowth layer 22 formed of p-type AlGaN with a thickness of 200 nm between anode electrode 20 and third regrowth layer 7. Other configurations are the same as the nitride semiconductor device illustrated in FIG. 16.

According to this configuration, when the voltage of anode electrode 20 is 0 V, that is, a zero bias, two-dimensional electron gas layer 9 is depleted by the depletion layer which extends due to fourth regrowth layer 22, and it is possible to reduce the leakage current of the portion at which anode electrode 20 and two-dimensional electron gas layer 9 come into contact.

The layer thickness of first regrowth layer 6 is 1 μm in first opening 14.

The layer thickness of each semiconductor layer other than first regrowth layer 6 and the conditions of each electrode are as illustrated in the Table 1.

According to the configuration, it is possible to make two-dimensional electron gas layer 9 formed between first regrowth layer 6 and the second regrowth layer substantially flat and parallel to the C-plane, and to suppress a reduction in the sheet carrier density of two-dimensional electron gas layer 9.

According to the configuration, it is possible for the Schottky junction in which electric field concentration is avoided as much as possible to move to a location with less electric field concentration. Accordingly, it is possible to increase the breakdown voltage of the nitride semiconductor device.

According to this configuration, when the voltage of anode electrode 20 is 0 V, that is, a zero bias, two-dimensional electron gas layer 9 is depleted by the depletion layer which extends due to fourth regrowth layer 22, and it is possible to reduce the leakage current of the portion at which anode electrode 20 and two-dimensional electron gas layer 9 come into contact.

Fifth Exemplary Embodiment

Although there is one channel in the third and fourth exemplary embodiments, a nitride semiconductor device having a plurality of channels will be described. The semiconductor device is a diode.

Figure 18:
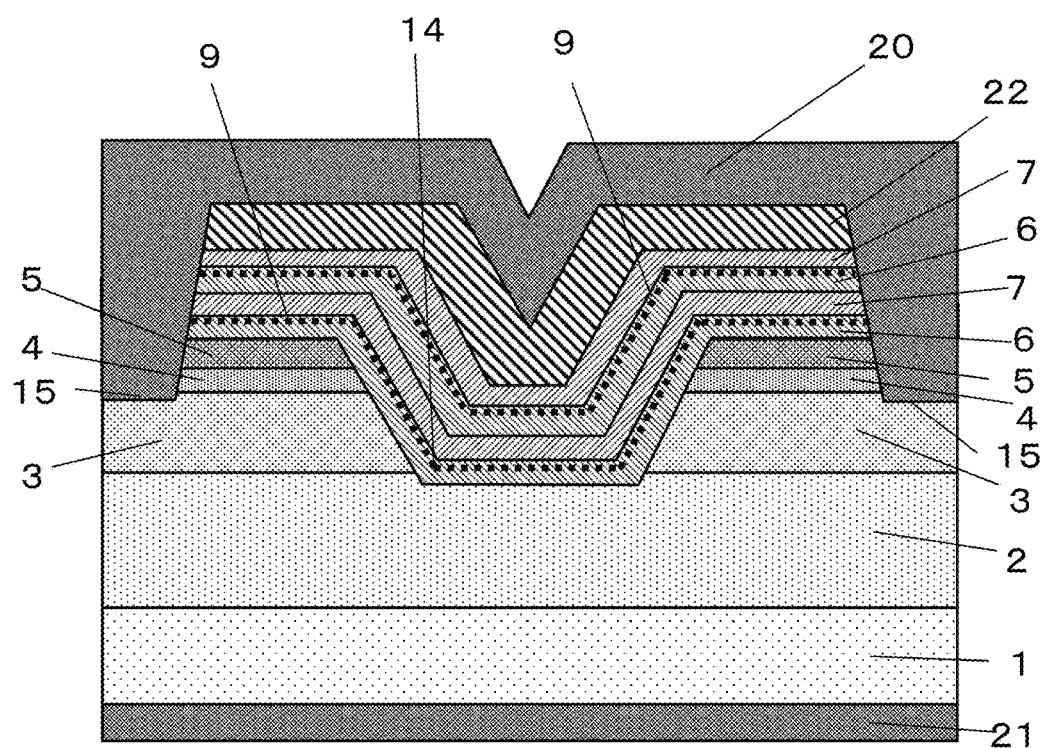
FIG. 18 is a cross-sectional view of a nitride semiconductor device of a fifth exemplary embodiment.
Figure 19:
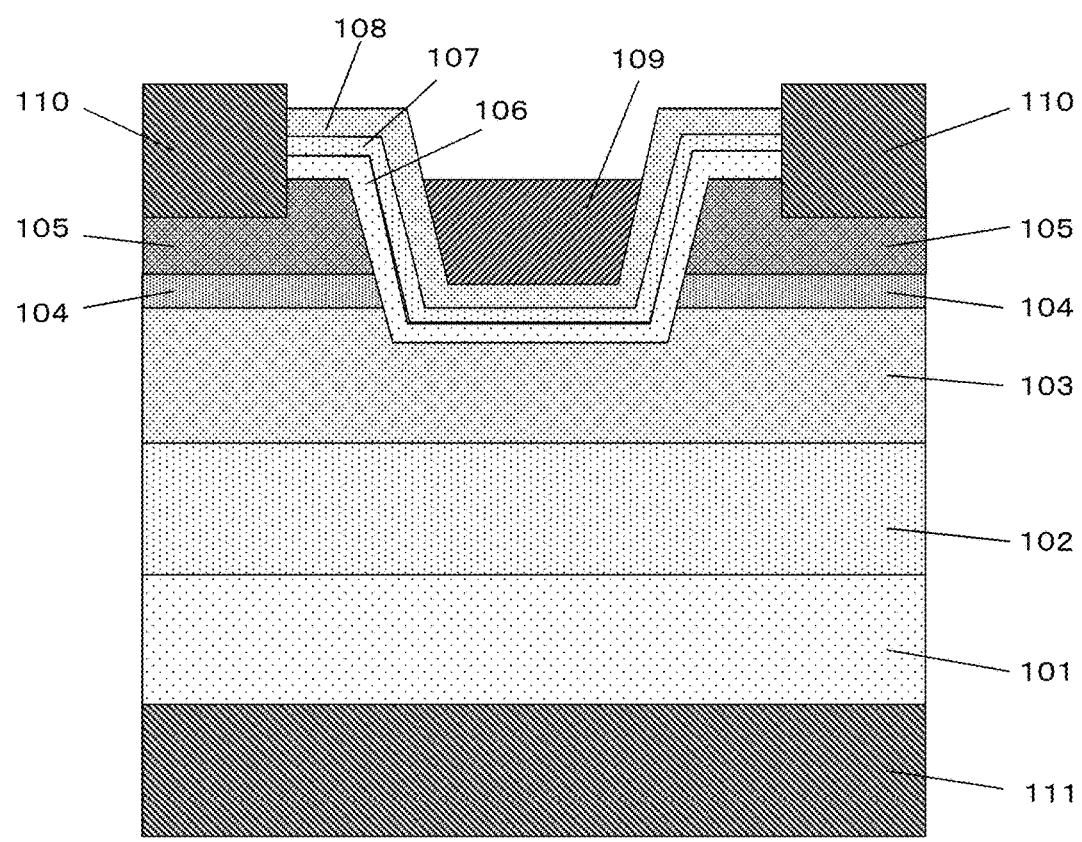
FIG. 19 is a cross-sectional view of a field effect transistor in the related art.

FIG. 18 illustrates a cross-sectional view of the nitride semiconductor device of the exemplary embodiment. In the nitride semiconductor device of the exemplary embodiment, drift layer 2 with a thickness of 8 μm, first base layer 3 with a thickness of 400 nm, and second base layer 4 with a thickness of 200 nm are formed in this order on substrate 1, and first opening 14 that reaches drift layer 2 passing through each GaN-based semiconductor layer is formed on second base layer 4. Si is added to drift layer 2, and the donor concentration is made $1 \times 10^{16}$ cm$^{-3}$. Mg is added to first base layer 3, and the acceptor density becomes $1 \times 10^{19}$ cm$^{-3}$.

First regrowth layer 6 formed of undoped GaN with a thickness of 100 nm formed by regrowth so as to cover first opening 14, a second regrowth layer with a thickness of 1 nm formed of undoped AlN with a thickness of 1 nm, not shown, and third regrowth layer 7 formed of undoped Al$_{0.2}$Ga$_{0.8}$N with a thickness of 50 nm are formed as one cycle in a plurality of cycles in this order. In FIG. 18, a diode is illustrated in a case of two periods (number of channels: 2).

Two-dimensional electron gas layer 9 is formed at the interface between first regrowth layer 6 and the second regrowth layer, and two-dimensional electron gas layer 9 forms an electron transit layer (channel layer) of the nitride semiconductor device.

After forming third regrowth layer 7, second opening 15 which reaches first base layer 3 is formed on third regrowth layer 7 separated from first opening 14. Anode electrode 20 formed of Pd is formed to cover first opening 14 and second opening 15, and two-dimensional electron gas layer 9 and anode electrode 20 come into electrical contact in second opening 15.

The main surface of each semiconductor layer formed on substrate 1 is the C-plane.

After forming a plurality of channel cycles, second opening 15 which reaches first base layer 3 is formed on third regrowth layer 7 separated from first opening 14. Anode electrode 20 formed of Pd is formed to cover first opening 14 and second opening 15, and two-dimensional electron gas layer 9 and anode electrode 20 come into electrical contact in second opening 15.

The main surface of each semiconductor layer formed on substrate 1 is the C-plane.

Any material may be used as the material of anode electrode 20 as long as the material establishes Schottky contact with the n-type nitride semiconductor, and it is possible to use a material which includes Ni, Au, WSi and the like.

Here a case where second opening 15 reaches first base layer 3 is disclosed, and, by doing so, it is more preferable because it is possible to fix the potential of first base layer 3 and the potential of anode electrode 20 and stabilize the operation. However, it is not necessary for second opening 15 to reach first base layer 3, and the depth of the second opening may be sufficient for all of two-dimensional electron gas layer 9 and anode electrode 20 to come into electrical contact.

Cathode electrode 21 is formed from a layered body of Ti and Al and is formed in the order of Ti, Al (Ti/Al) on the rear surface side of substrate 1, and makes ohmic contact with substrate 1. The electrode material of cathode electrode 21 may be any material as long as the material establishes ohmic contact with respect to the n-type, and examples include Ti/Au.

Because it is possible for a plurality of channels of two-dimensional electron gas layer 9 to be formed in the configuration, the resistance of the channel can be further reduced compared to a diode having 1 channel.

INDUSTRIAL APPLICABILITY

The nitride semiconductor device of the disclosure is useful as a power device used in a power source circuit of consumer equipment.

What is claimed is:

1. A nitride semiconductor device, comprising:
a substrate;
a first nitride semiconductor layer formed on the substrate and which has a C-plane as a main surface;
a second nitride semiconductor layer formed on the first nitride semiconductor layer and which has p-type conductivity;
a first opening formed in the second nitride semiconductor layer and which reaches the first nitride semiconductor layer;
a third nitride semiconductor layer formed to cover the first opening in the second nitride semiconductor layer and which is formed from a nitride semiconductor;
a first electrode formed on the third nitride semiconductor layer to include a region of the first opening; and
a second electrode formed on a rear surface of the substrate,
wherein a layer thickness Gx of the third nitride semiconductor layer, the layer thickness Gx being in a direction parallel to the C-plane on a side wall of the first opening, is thicker than a layer thickness Gy of the third nitride semiconductor layer, the layer thickness Gy being in a direction perpendicular to the C-plane in a flat section on an outside of the first opening, and
a layer thickness L of the third nitride semiconductor layer on the side wall of the first opening, the layer thickness L being in a direction perpendicular to the side wall and taken at a center of the side wall, is thicker than the layer thickness Gy.

2. The nitride semiconductor device of claim 1, further comprising:
a third electrode on the third nitride semiconductor layer and at a position separated from the first electrode.

3. The nitride semiconductor device of claim 1,
wherein a fourth nitride semiconductor layer is formed on the third nitride semiconductor layer, and
a layer thickness Ax of the fourth nitride semiconductor layer, the layer thickness Ax being in a direction parallel to the C-plane on the side wall of the first opening, is thicker than a layer thickness Ay of the fourth nitride semiconductor layer, the layer thickness Ay being in a direction perpendicular to the C-plane in a flat section on the outside of the first opening.

4. The nitride semiconductor device of claim 3, wherein Gx/Gy is greater than Ax/Ay.

5. The nitride semiconductor device of claim 1, wherein a fifth nitride semiconductor layer which has p-type conductivity is formed between the first electrode and the third nitride semiconductor layer.

6. The nitride semiconductor device of claim 1, wherein an end portion of the first electrode or an end portion of a fifth nitride semiconductor layer is positioned on the outside of the first opening.

7. The nitride semiconductor device of claim 2, further comprising:
a second opening which extends from the third nitride semiconductor layer as far as the second nitride semiconductor layer,
wherein the third electrode is formed in the second opening.

8. The nitride semiconductor device of claim 1, further comprising:
a fourth semiconductor layer formed from an undoped nitride semiconductor and arranged between the second nitride semiconductor layer and the third nitride semiconductor layer.

9. The nitride semiconductor device of claim 8,
wherein the fourth semiconductor layer is formed of two layers, and
a band gap of one of the two layers closer to the second nitride semiconductor layer is smaller than a band gap of the other of the two layers closer to the third nitride semiconductor layer.

10. The nitride semiconductor device of claim 1, further comprising:
a block layer which is formed on the second nitride semiconductor layer, and is formed from an insulating or semi-insulating nitride semiconductor layer; and
a fourth nitride semiconductor layer with a larger band gap than the third nitride semiconductor layer,
wherein the third nitride semiconductor layer is formed on the block layer, and
the first opening extends from the block layer to the first nitride semiconductor layer.

11. The nitride semiconductor device of claim 10, wherein the block layer is a GaN layer to which $3\times10^{17}$ cm$^{-3}$ or more of C is added.

12. The nitride semiconductor device of claim 10, wherein the block layer is a GaN layer to which one or more of Fe, Mg, and B is injected.

13. The nitride semiconductor device of claim 10, further comprising:
a second opening which extends from the fourth nitride semiconductor layer to the second nitride semiconductor layer and which is arranged at a position different from a position of the first opening.

14. The nitride semiconductor device of claim 10, wherein a fifth nitride semiconductor layer which has p-type conductivity is provided between the first electrode and the fourth nitride semiconductor layer.

15. The nitride semiconductor device of claim 13, further comprising:
a third electrode which is different from the first electrode, has ohmic characteristics and is arranged in the second opening.

16. The nitride semiconductor device of claim 13, wherein the second nitride semiconductor layer is formed directly below the second opening and contacts the block layer and the first nitride semiconductor layer in the first opening.

* * * * *